United States Patent
Hui et al.

(10) Patent No.: US 10,333,560 B2
(45) Date of Patent: Jun. 25, 2019

(54) SOFT DECODING OF RATE-COMPATIBLE POLAR CODES

(71) Applicant: Telefonaktiebolaget LM Ericsson (publ), Stockholm (SE)

(72) Inventors: Dennis Hui, Sunnyvale, CA (US); Mattias Andersson, Sundbyberg (SE); Yufei Blankenship, Kildeer, IL (US); Ivana Maric, Stanford, CT (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 15/564,240

(22) PCT Filed: Aug. 10, 2017

(86) PCT No.: PCT/IB2017/054882
§ 371 (c)(1),
(2) Date: Oct. 4, 2017

(87) PCT Pub. No.: WO2018/029628
PCT Pub. Date: Feb. 15, 2018

(65) Prior Publication Data
US 2018/0262214 A1    Sep. 13, 2018

Related U.S. Application Data

(60) Provisional application No. 62/374,246, filed on Aug. 12, 2016.

(51) Int. Cl.
*H04L 1/18*    (2006.01)
*H03M 13/00*    (2006.01)
(Continued)

(52) U.S. Cl.
CPC ....... *H03M 13/3784* (2013.01); *H03M 13/13* (2013.01); *H03M 13/2963* (2013.01);
(Continued)

(58) Field of Classification Search
CPC ......... H03M 13/3784; H03M 13/6306; H03M 13/6368; H03M 13/13; H03M 13/2963; H04L 1/1819
See application file for complete search history.

(56) References Cited

U.S. PATENT DOCUMENTS

| 10,028,210 B1 * | 7/2018 | Nammi | H04W 48/16 |
| 2014/0019820 A1 * | 1/2014 | Vardy | H03M 13/13 |
| | | | 714/752 |
| 2018/0115393 A1 * | 4/2018 | Zhang | H04L 1/0041 |

OTHER PUBLICATIONS

M. Alsan, "A lower bound on achievable rates by polar codes with mismatch polar decoding," 2013 IEEE Information Theory Workshop (ITW), Sevilla, 2013, pp. 1-5.*
(Continued)

*Primary Examiner* — Cynthia Britt
(74) *Attorney, Agent, or Firm* — Baker Botts, LLP

(57) ABSTRACT

A node (110, 115) receives (804) transmissions associated with a given set of information bits, wherein each of the transmissions use a different polar code and share one or more information bits of the given set of information bits. The node determines (808), at each of a plurality of polar decoders (505, 605) of the node, soft information for each information bit included in an associated one of the transmissions, wherein each of the plurality of polar decoders is associated with a different transmission of the transmissions. The node provides (812), from each polar decoder of the plurality to one or more other polar decoders of the plurality, the determined soft information for any information bits shared by their respective associated transmissions, and uses (816) the provided soft information in an iterative decoding process to decode one or more of the received transmissions.

24 Claims, 15 Drawing Sheets

(51) Int. Cl.
*H03M 13/37* (2006.01)
*H03M 13/13* (2006.01)
*H03M 13/29* (2006.01)

(52) U.S. Cl.
CPC ... *H03M 13/6306* (2013.01); *H03M 13/6368* (2013.01); *H04L 1/1819* (2013.01)

(56) References Cited

OTHER PUBLICATIONS

K. Niu, K. Chen and J. Lin, "Beyond turbo codes: Rate-compatible punctured polar codes," 2013 IEEE International Conference on Communications (ICC), Budapest, 2013, pp. 3423-3427.*
Capacity-Achieving Rate-Compatible Polar Codes by Song-Nam Hong et al.; 2016 IEEE International Symposium on Information Theory—2016.
Capacity-Achieving Rateless Polar Codes by Bin Li et al.; 2016 IEEE International Symposium on Information Theory—2016.
Channel Polarization: A Method for Constructing Capacity-Achieving Codes for Symmetric Binary-Input Memoryless Channels by Erdal Arikan; IEEE Transactions on Information Theory, vol. 55, No. 7—Jul. 2009.
List Decoding of Polar Codes by Ido Tal et al.; 2011 IEEE International Symposium on Information Theory Proceedings—2011.
Ubaid U. Fayyaz and John R. Barry, Polar Codes for Partial Response Channels, 2013 IEEE International Conference on Communications—Selected Areas in Communications Symposium, XP032522442, Jun. 9, 2013, 5 pages.
Wu Dongsheng et al., Parallel concatenated systematic polar codes, Electronics Letters, vol. 52, No. 1, XP006054852, Jan. 8, 2016, 2 pages.
Song-Nam Hong et al., Capacity-Achieving Rate-Compatible Polar Codes, 2016 IEEE International Symposium on Information Theory, IEEE, XP032940199, Jul. 10, 2016, 5 pages.
PCT, Notification of Transmittal of the International Search Report and the Written Opinion of the International Searching Authority, or the Declaration, International Application No. PCT/IB2017/054882, 5 pages, dated Nov. 14, 2017.
PCT, Written Opinion of the International Searching Authority, International Application No. PCT/IB2017/054882, 9 pages, dated Nov. 14, 2017.

* cited by examiner

Example polar code structure in a first transmission in HARQ incremental redundancy Example polar code structure in a second transmission (i.e., first retransmission) in HARQ incremental redundancy Example polar code structure in a third transmission (i.e., second retransmission) in HARQ incremental redundancy Example of how soft and hard information is generated in successive decoding of polar codes

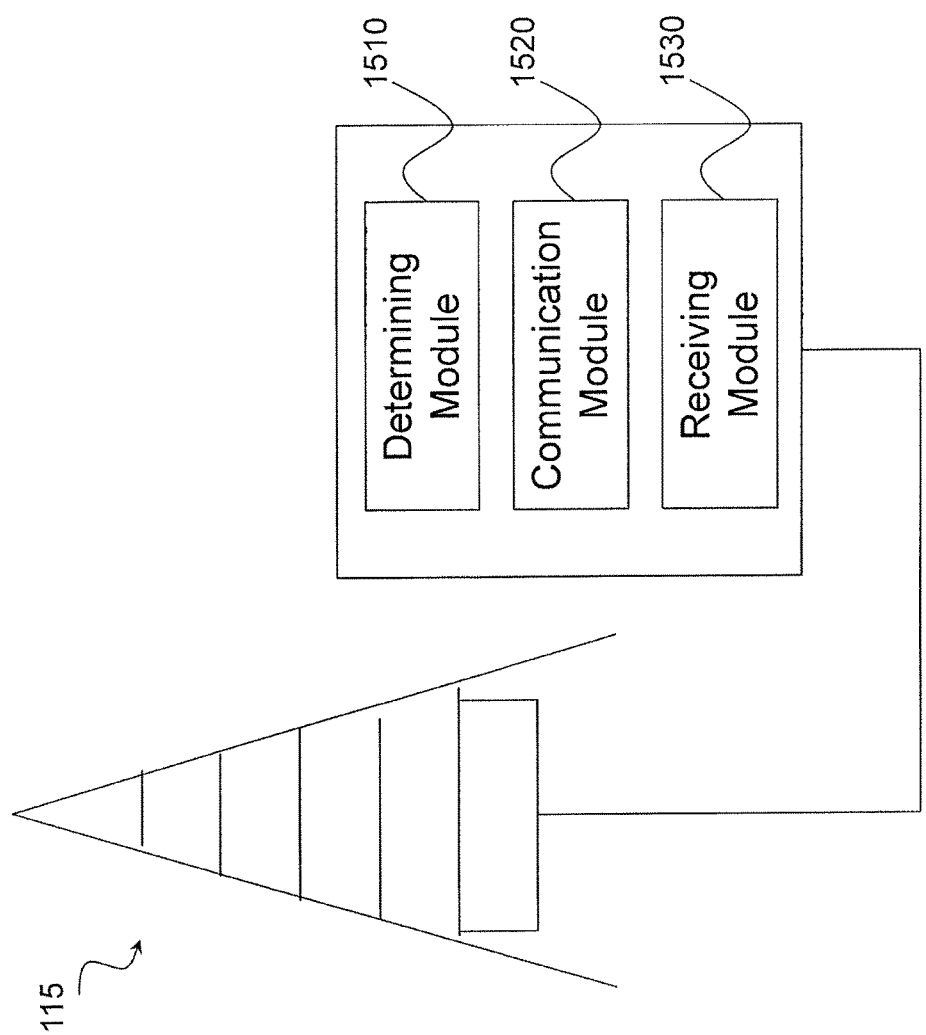

SOFT DECODING OF RATE-COMPATIBLE POLAR CODES

PRIORITY

This nonprovisional application is a U.S. National Stage Filing under 35 U.S.C. § 371 of International Patent Application Serial No. PCT/IB2017/054882 filed Aug. 10, 2017, and entitled "Soft Decoding Of Rate-Compatible Polar Codes" which claims priority to U.S. Provisional Patent Application No. 62/374,246 filed Aug. 12, 2016, both of which are hereby incorporated by reference in their entirety.

TECHNICAL FIELD

The present disclosure relates, in general, to wireless communications and, more particularly, to soft decoding of rate-compatible polar codes.

BACKGROUND

Polar codes, proposed by E. Arikan in "Channel Polarization: A Method for Constructing Capacity-Achieving Codes for Symmetric Binary-Input Memoryless Channels," IEEE Transactions on Information Theory, vol. 55, pp. 3051-3073, July 2009 (hereinafter "Arikan"), are the first class of constructive coding schemes that are provable to achieve the symmetric capacity of the binary-input discrete memoryless channels under a low-complexity successive cancellation (SC) decoder. However, the finite-length performance of polar codes under SC is not competitive compared to other modern channel coding schemes such as low-density parity-check (LDPC) codes and Turbo codes. Later, a SC list (SCL) decoder was proposed by I. Tal and A. Vardy in "List Decoding of polar codes," Proceedings of IEEE Symp. Inf. Theory, pp. 1-5, 2011 (hereinafter "Tal"), which can approach the performance of the optimal maximum-likelihood (ML) decoder. By concatenating simple Cyclic Redundancy Check (CRC) coding, it was shown that the performance of concatenated polar codes is competitive with that of well-optimized LDPC and Turbo codes. As a result, polar codes are being considered as a candidate for future wireless communication systems, such as 5G.

The main idea of polar coding is to transform a pair of identical binary-input channels into two distinct channels of different qualities, one better and one worse than the original binary-input channel. By repeating such a pair-wise polarizing operation on a set of $2^M$ independent uses of a binary-input channel, a set of $2^M$ "bit-channels" of varying qualities can be obtained. Some of these bit channels are nearly perfect (i.e., error free) while the rest of them are nearly useless (i.e., totally noisy). The point is to use the nearly perfect channel to transmit data to the receiver while setting the input to the useless channels to have fixed or frozen values (e.g., 0) known to the receiver. For this reason, those input bits to the nearly useless and the nearly perfect channel are commonly referred to as frozen bits and non-frozen (or information) bits, respectively. Only the non-frozen bits are used to carry data in a polar code.

Wireless broadband systems require flexible and adaptive transmission techniques because they operate in the presence of time-varying channels. For such systems, hybrid automatic repeat request based on incremental redundancy (HARQ-IR) schemes are often used, where parity bits are sent in an incremental fashion depending on the quality of the time-varying channel. IR systems require the use of rate-compatible punctured codes. According to the rate requirement, an appropriate number of coded bits are sent by the transmitter during the first transmission or subsequent retransmissions. Here, the set of coded bits of a higher rate code should be a subset of the set of coded bits of a lower rate code. In HARQ-IR systems, therefore, if the receiver fails to decode at a particular rate, it only needs to request additional coded bits to be transmitted in subsequent retransmissions by the transmitter. There has been extensive research on the construction of rate-compatible Turbo codes and LDPC codes. However, there is relatively few research done on rate-compatible polar codes.

FIG. 1 illustrates an example of polar code structure in a first transmission in HARQ incremental redundancy. More particularly, FIG. 1 illustrates the structure of a length-8 polar code. In the first transmission illustrated in FIG. 1, six out of eight bit channels of the length-8 polar code are loaded with data (non-frozen or information bits $u_0$ through $u_5$) while the rest are frozen (assigned a value of zero, which is known to the receiver), giving an overall code rate of ¾.

In both S. Hong, D. Hui, I. Maric, "Capacity Achieving Rate-Compatible Polar Codes," Proc. ISIT, Bacelona, July 2016 (hereinafter "Hong") and B. Li, D. Tse, K. Chen, H. Shen, "Capacity-Achieving Rateless Polar Codes," Proc. ISIT, Bacelona, July 2016, a new class of rate-compatible polar codes was introduced to allow HARQ-IR retransmissions. For HARQ schemes that adopt this class of codes, each transmission (or retransmission) uses a separate polar code (with its own associated polar encoder) to generate a separate code block. A portion of non-frozen bits (e.g., a portion of non-frozen bits $u_0$ through $u_5$ in the example of FIG. 1) used in each of the previous transmissions are aggregated, re-encoded and transmitted in a subsequent retransmission. The amount of non-frozen bits taken from each previous transmission to form the new retransmission is determined in such a way that each of the previous (re-)transmissions would result in the same effective (lowered) coding rate if all subsequent transmissions are decoded successfully, and the decoded bits are used as frozen bits.

The aforementioned class of rate-compatible polar codes can be illustrated by an example using the three transmissions illustrated in FIGS. 1-3. As noted above, in the first transmission illustrated in FIG. 1, six out of the eight bit channels of a length-8 polar code are loaded with data while the rest are frozen, giving an overall code rate of ¾. If the receiver fails to decode the six information bits ($u_0$ through $u_5$), another length-8 polar code may be used to re-transmit the least reliable bits, which in the example of FIG. 1 are $u_3$, $u_4$, and $u_5$. This first retransmission illustrated in FIG. 2, described below.

FIG. 2 illustrates an example of polar code structure in a second transmission (i.e., first retransmission) in HARQ incremental redundancy. If the receiver fails to decode the six information bits in the first transmission, another length-8 polar code such as the one illustrated in FIG. 2 may be used to re-transmit the three least reliable bits ($u_3$, $u_4$, $u_5$). In the example of FIG. 2, the code rate in the $2^{nd}$ code block is ⅜. Thus, the effective code rate of the $1^{st}$ code block in the first transmission of FIG. 1 is also reduced from ¾ to ⅜ if the bits ($u_3$, $u_4$, $u_5$) are successively decoded by the receiver from the $2^{nd}$ code block and used as frozen bits to decode the first code block. If the receiver fails again to decode the $2^{nd}$ transmission (i.e., first retransmission) of FIG. 2, the least reliable bit of the $2^{nd}$ transmission, which in the example of FIG. 2 is $u_3$, and the next least reliable bit $u_2$ of the $1^{st}$ transmission in the example of FIG. 1 (assuming not all data bits in the $2^{nd}$ transmission have been successively decoded) are retransmitted using another length-8 polar code.

FIG. 3 illustrates an example of polar code structure in a third transmission (i.e., second retransmission) in HARQ incremental redundancy. If the receiver fails again to decode the second transmission (i.e., first retransmission) of FIG. 2, the least reliable bit of the $2^{nd}$ transmission, which in the example of FIG. 2 is $u_3$, and the next least reliable bit $u_2$ of the $1^{st}$ transmission in the example of FIG. 1 (assuming not all data bits in the $2^{nd}$ transmission has been successively decoded) are retransmitted using another length-8 polar code such as the one illustrated in the example of FIG. 3. In this case, the effective code rates of all three code blocks of the three transmissions are all reduced to from ⅜ to ¼, assuming that all data bits in subsequent retransmissions are successively decoded and used as frozen bits in corresponding previous transmissions.

A method of successively decoding over multiple transmissions was also proposed in Hong. In this method, a decoder first decodes the most recent code block in the last retransmission and then uses the decoded (hard) bits as frozen bits to decode the previous (re)transmission until the first transmission is decoded. It can be shown that this simple decoding method achieves the aggregated capacity of all retransmissions.

Although the aforementioned successive decoding method over multiple transmissions achieves capacity, the decoding method is suboptimal in terms of block error performance. The reasons for this are twofold. First, decoding of code blocks of subsequent retransmissions does not take into account the information contained in the previous transmissions. As a result, the block error performance is limited by the block length of each individual transmission and does not benefit from the sum block length over all transmissions. Second, exchange of hard bits between one code block and another does not account for the reliability of the decoded information (non-frozen) bits.

SUMMARY

To address the foregoing problems with existing approaches, disclosed is a method in a node. The method comprises receiving a plurality of transmissions associated with a given set of information bits, wherein each of the plurality of transmissions use a different polar code and share one or more information bits of the given set of information bits. The method comprises determining, at each of a plurality of polar decoders of the node, soft information for each information bit included in an associated one of the plurality of transmissions, wherein each of the plurality of polar decoders is associated with a different transmission of the plurality of transmissions. The method comprises providing, from each polar decoder of the plurality to one or more other polar decoders of the plurality, the determined soft information for any information bits shared by their respective associated transmissions, and using the provided soft information in an iterative decoding process to decode one or more of the received plurality of transmissions.

In certain embodiments, the soft information may comprise one or more of probabilities or log-likelihood ratios. In certain embodiments, the method may comprise scaling the soft information by a factor.

In certain embodiments, the soft information may be determined based on a log-likelihood ratio of one or more channel bits received from a demodulator and the soft information provided from the one or more other polar decoders of the plurality for any information bits shared by their respective associated transmissions. The soft information provided from the one or more other polar decoders of the plurality may comprise soft information from one or more polar decoders of previous transmissions for a subset of information bits shared by their respective transmissions. The soft information provided from the one or more other polar decoders of the plurality may comprise soft information from one or more polar decoders of subsequent transmissions for a subset of information bits shared by their respective transmissions.

In certain embodiments, the method may comprise determining, at a first polar decoder associated with a first transmission of the plurality of transmissions, soft information for each information bit in the first transmission. The method may comprise providing, from the first polar decoder associated with the first transmission to a second polar decoder associated with a second transmission, the soft information for each information bit in the first transmission included in a subset of information bits shared by the first transmission and the second transmission. The method may comprise determining, at the second polar decoder associated with the second transmission of the plurality of transmissions, soft information for each information bit in the subset of information bits shared by the first transmission and the second transmission. The method may comprise providing, from the second polar decoder associated with the second transmission to the first polar decoder associated with the first transmission, the soft information for each information bit in the subset of information bits shared by the first transmission and the second transmission. In certain embodiments, the method may comprise determining, by the first polar decoder, a hard decision for each information bit of the first transmission based on the soft information provided by the second polar decoder for each information bit in the subset of information bits shared by the first transmission and the second transmission.

In certain embodiments, the method may comprise storing the determined soft information. The method may comprise retrieving the stored soft information and using it to decode a first transmission of the plurality of transmissions and another transmission of the plurality of transmissions.

In certain embodiments, the plurality of transmissions associated with a given set of information bits may comprise an initial transmission and a plurality of retransmissions. The plurality of polar decoders may comprise successive cancellation decoders.

Also disclosed is a node. The node comprises processing circuitry. The processing circuitry is configured to receive a plurality of transmissions associated with a given set of information bits, wherein each of the plurality of transmissions use a different polar code and share one or more information bits of the given set of information bits. The processing circuitry is configured to determine, at each of a plurality of polar decoders of the node, soft information for each information bit included in an associated one of the plurality of transmissions, wherein each of the plurality of polar decoders is associated with a different transmission of the plurality of transmissions. The processing circuitry is configured to provide, from each polar decoder of the plurality to one or more other polar decoders of the plurality, the determined soft information for any information bits shared by their respective associated transmissions, and use the provided soft information in an iterative decoding process to decode one or more of the received plurality of transmissions.

Certain embodiments of the present disclosure may provide one or more technical advantages. For example, certain embodiments may advantageously enable a decoder of a class of rate-compatible polar codes to effectively take advantage of the aggregated block lengths after multiple transmissions to improve the block error rate and the number of retransmissions needed to pass CRC for a target block error rate. Other advantages may be readily apparent to one having skill in the art. Certain embodiments may have none, some, or all of the recited advantages.

BRIEF DESCRIPTION OF THE DRAWINGS

For a more complete understanding of the disclosed embodiments and their features and advantages, reference is now made to the following description, taken in conjunction with the accompanying drawings, in which:

FIG. 15 is a block schematic of an exemplary network node, in accordance with certain embodiments.

DETAILED DESCRIPTION

Figure 1:
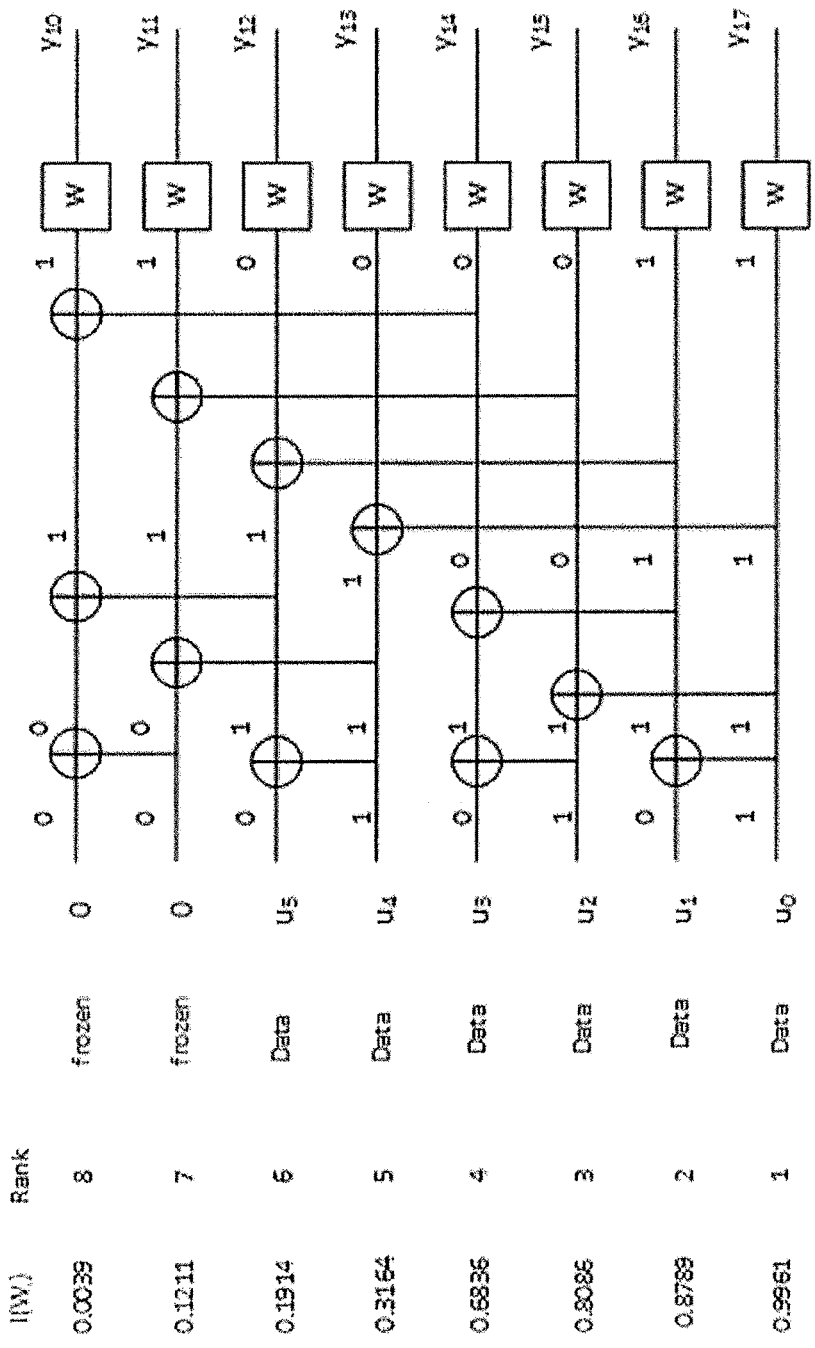
FIG. 1 illustrates an example of polar code structure in a first transmission in HARQ incremental redundancy.

As described above, existing approaches to successively decoding polar codes over multiple transmissions use a decoder that first decodes the most recent code block in the last retransmission and then uses the decoded (hard) bits as frozen bits to decode the previous (re)transmission until the first transmission is decoded. Although it achieves capacity, there are certain deficiencies associated with such an approach. For example, this approach to decoding is sub-optimal in terms of block error performance. The reasons for this are twofold. First, decoding of code blocks of subsequent retransmissions does not take into account the information contained in the previous transmissions. As a result, the block error performance is limited by the block length of each individual transmission and does not benefit from the sum block length over all transmissions. Second, exchange of hard bits between one code block and another does not account for the reliability of the decoded information (non-frozen) bits.

The present disclosure contemplates various embodiments that may address these and other deficiencies associated with existing approaches. For example, embodiments described herein relate to a decoding process that allows soft information to be exchanged among code blocks of different transmissions associated with a given set of information bits, so that the soft information of an individual information bit is exchanged among all code blocks that contain the information bit. This allows each information bit to derive benefit from every (re)transmission that contains the bit, instead of only the most recent (re)transmission. In certain embodiments, the soft information may be expressed in the form of probabilities or log-likelihood ratios (LLR).

According to one example embodiment, a method in a node (e.g., wireless device or network node) is disclosed. The node receives a plurality of transmissions associated with a given set of information bits, wherein each of the plurality of transmissions use a different polar code and share one or more information bits of the given set of information bits. The node determines, at each of a plurality of polar decoders of the node, soft information for each information bit included in an associated one of the plurality of transmissions, wherein each of the plurality of polar decoders is associated with a different transmission of the plurality of transmissions. The node provides, from each polar decoder of the plurality to one or more other polar decoders of the plurality, the determined soft information for any information bits shared by their respective associated transmissions, and uses the provided soft information in an iterative decoding process to decode one or more of the received plurality of transmissions.

Certain embodiments of the present disclosure may provide one or more technical advantages. For example, certain embodiments may advantageously enable a decoder of a class of rate-compatible polar codes to effectively take advantage of the aggregated block lengths after multiple transmissions to improve the block error rate and the number of retransmissions needed to pass CRC for a target block error rate. Other advantages may be readily apparent to one having skill in the art. Certain embodiments may have none, some, or all of the recited advantages.

In the following description, numerous specific details are set forth. However, it is understood that embodiments of the present disclosure may be practiced without these specific details. In other instances, well-known circuits, structures and techniques have not been shown in detail in order not to obscure the understanding of this description. Those of ordinary skill in the art, with the included descriptions, will be able to implement appropriate functionality without undue experimentation.

References in the specification to "one embodiment," "an embodiment," "an example embodiment," "certain embodiments," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to implement such feature, structure, or characteristic in connection with other embodiments whether or not explicitly described.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

Figure 4:
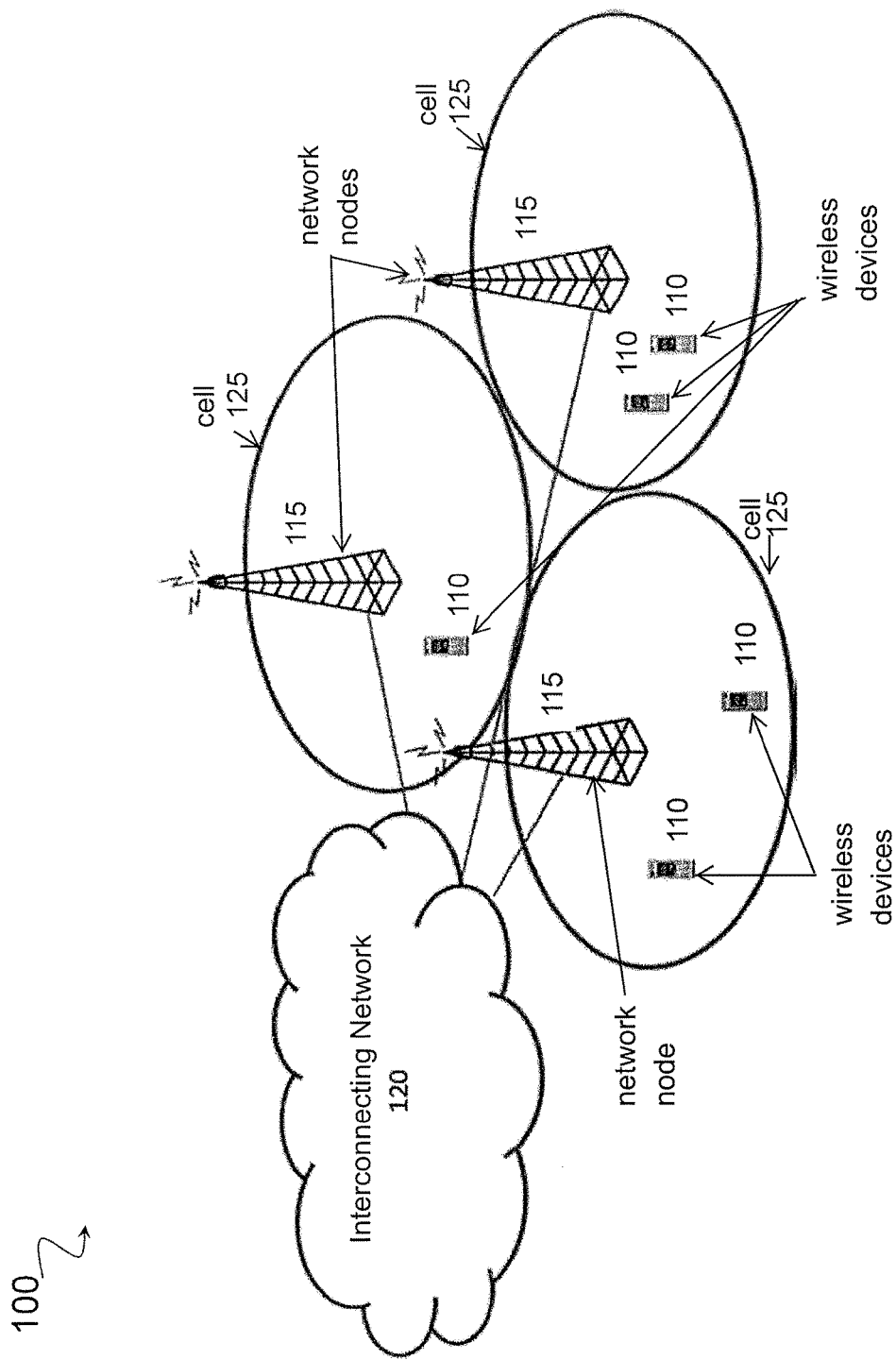
FIG. 4 is a block diagram illustrating an embodiment of a network, in accordance with certain embodiments.

FIG. 4 is a block diagram illustrating an embodiment of a network 100, in accordance with certain embodiments. Network 100 includes one or more wireless devices 110 and one or more network nodes 115. Wireless devices 110 may communicate with network nodes 115 over a wireless interface. For example, wireless device 110 may transmit wireless signals to one or more of network nodes 115, and/or receive wireless signals from one or more of network nodes 115. The wireless signals may contain voice traffic, data traffic, control signals, and/or any other suitable information. In some embodiments, an area of wireless signal coverage associated with a network node 115 may be referred to as a cell 125. In some embodiments, wireless device 110 may have device-to-device (D2D) capability. Thus, wireless devices 110 may be able to receive signals from and/or transmit signals directly to another wireless device.

In certain embodiments, network nodes 115 may interface with a radio network controller. The radio network controller may control network nodes 115 and may provide certain radio resource management functions, mobility management functions, and/or other suitable functions. In certain embodiments, the functions of the radio network controller may be included in network node 115. The radio network controller may interface with a core network node. In certain embodiments, the radio network controller may interface with the core network node via an interconnecting network 120. Interconnecting network 120 may refer to any interconnecting system capable of transmitting audio, video, signals, data, messages, or any combination of the preceding. Interconnecting network 120 may include all or a portion of one or more Internet Protocol (IP) networks, public switched telephone networks (PSTNs), packet data networks, optical networks, public or private data networks, local area networks (LANs), wireless local area networks (WLANs), wired networks, wireless networks, metropolitan area networks (MANs), wide area networks (WAN), a local, regional, or global communication or computer network such as the Internet, an enterprise intranet, or any other suitable communication links, including combinations thereof, to enable communication between devices.

In some embodiments, the core network node may manage the establishment of communication sessions and various other functionalities for wireless devices 110. Wireless devices 110 may exchange certain signals with the core network node using the non-access stratum layer. In non-access stratum signaling, signals between wireless devices 110 and the core network node may be transparently passed through the radio access network (RAN). In certain embodiments, network nodes 115 may interface with one or more network nodes over an internode interface, such as, for example, an X2 interface.

As described above, example embodiments of network 100 may include one or more wireless devices 110, and one or more different types of network nodes 115 capable of communicating (directly or indirectly) with wireless devices 110.

In some embodiments, the non-limiting term wireless device is used. Wireless devices 110 described herein can be any type of wireless device capable, configured, arranged and/or operable to communicate wirelessly with network nodes 115 and/or another wireless device, for example over radio signals. Communicating wirelessly may involve transmitting and/or receiving wireless signals using electromagnetic signals, radio waves, infrared signals, and/or other types of signals suitable for conveying information through air. In particular embodiments, wireless devices may be configured to transmit and/or receive information without direct human interaction. For instance, a wireless device may be designed to transmit information to a network on a predetermined schedule, when triggered by an internal or external event, or in response to requests from the network. Generally, a wireless device may represent any device capable of, configured for, arranged for, and/or operable for wireless communication, for example radio communication devices. Examples of wireless devices include, but are not limited to, user equipment (UEs) such as smart phones. Further examples include wireless cameras, wireless-enabled tablet computers, laptop-embedded equipment (LEE), laptop-mounted equipment (LME), USB dongles, and/or wireless customer-premises equipment (CPE). Wireless device 110 may also be a radio communication device, target device, D2D UE, machine-type-communication (MTC) UE or UE capable of machine-to-machine (M2M) communication, low-cost and/or low-complexity UE, a sensor equipped with UE, Tablet, mobile terminals, an Internet of Things (IoT) device, or a Narrowband IoT (NB-IOT) device, or any other suitable devices.

As one specific example, wireless device 110 may represent a UE configured for communication in accordance with one or more communication standards promulgated by the $3^{rd}$ Generation Partnership Project (3GPP), such as 3GPP's Global System for New Radio (NR), Mobile Communications (GSM), Universal Mobile Telecommunications System (UMTS), Long Term Evolution (LTE), and/or other suitable 2G, 3G, 4G or 5G standards or other suitable standards. As used herein, a "UE" may not necessarily have a "user" in the sense of a human user who owns and/or operates the relevant device. Instead, a UE may represent a device that is intended for sale to, or operation by, a human user but that may not initially be associated with a specific human user.

Wireless device 110 may support D2D communication, for example by implementing a 3GPP standard for sidelink communication, and may in this case be referred to as a D2D communication device.

As yet another specific example, in an IoT scenario, a wireless device may represent a machine or other device that performs monitoring and/or measurements, and transmits the results of such monitoring and/or measurements to another wireless device and/or a network node. The wireless device may in this case be a M2M device, which may in a 3GPP context be referred to as a MTC device. As one particular example, the wireless device may be a UE implementing the 3GPP NB-IoT standard. Particular examples of such machines or devices are sensors, metering devices such as power meters, industrial machinery, or home or personal appliances (e.g., refrigerators, televisions, personal wearables such as watches, etc.). In other scenarios, a wireless device may represent a vehicle or other equipment that is capable of monitoring and/or reporting on its operational status or other functions associated with its operation.

Wireless device 110 as described above may represent the endpoint of a wireless connection, in which case the device may be referred to as a wireless terminal. Furthermore, a wireless device as described above may be mobile, in which case it may also be referred to as a mobile device or a mobile terminal.

As depicted in FIG. 1, wireless device 110 may be any type of wireless endpoint, mobile station, mobile phone, wireless local loop phone, smartphone, user equipment, desktop computer, Personal Digital Assistant (PDA), cell phone, tablet, laptop, Voice Over IP (VoIP) phone or handset, which is able to wirelessly send and receive data and/or signals to and from a network node, such as network node 115 and/or other wireless devices.

Wireless device 110 (e.g., an end station, a network device) may store and transmit (internally and/or with other electronic devices over a network) code (composed of software instructions) and data using machine-readable media, such as non-transitory machine-readable media (e.g., machine-readable storage media such as magnetic disks; optical disks; read-only memory (ROM); flash memory devices; phase change memory) and transitory machine-readable transmission media (e.g., electrical, optical, acoustical or other form of propagated signals—such as carrier waves, infrared signals). In addition, wireless devices 110 may include hardware such as a set of one or more processors coupled to one or more other components, such as one or more non-transitory machine-readable media (to store code and/or data), user input/output devices (e.g., a keyboard, a touchscreen, and/or a display), and network connections (to transmit code and/or data using propagating signals). The coupling of the set of processors and other components is typically through one or more busses and bridges (also termed as bus controllers). Thus, a non-transitory machine-readable medium of a given electronic device typically stores instructions for execution on one or more processors of that electronic device. One or more parts of an embodiment described herein may be implemented using different combinations of software, firmware, and/or hardware.

Also, in some embodiments generic terminology, "network node" is used. As used herein, "network node" refers to equipment capable, configured, arranged and/or operable to communicate directly or indirectly with a wireless device and/or with other equipment (e.g., another network node) in the wireless communication network that enable and/or provide wireless access to the wireless device. Examples of network nodes include, but are not limited to, access points (APs), in particular radio access points. A network node may represent base stations (BSs), such as radio base stations. Particular examples of radio base stations include Node Bs, evolved Node Bs (eNBs), Master eNB (MeNB), Secondary eNB (SeNB), and gNBs. Base stations may be categorized based on the amount of coverage they provide (or, stated differently, their transmit power level) and may then also be referred to as femto base stations, pico base stations, micro base stations, or macro base stations. "Network node" also includes one or more (or all) parts of a distributed radio base station such as centralized digital units and/or remote radio units (RRUs), sometimes referred to as Remote Radio Heads (RRHs). Such remote radio units may or may not be integrated with an antenna as an antenna integrated radio. Parts of a distributed radio base stations may also be referred to as nodes in a distributed antenna system (DAS).

As a particular non-limiting example, a base station may be a relay node or a relay donor node controlling a relay.

Yet further examples of network nodes include a network node belonging to a Master Cell Group (MCG), a network node belonging to a Secondary Cell Group (SCG), multi-standard radio (MSR) radio equipment such as MSR BSs, network controllers such as radio network controllers (RNCs) or base station controllers (BSCs), base transceiver stations (BTSs), transmission points, transmission nodes, Multi-cell/multicast Coordination Entities (MCEs), core network nodes (e.g., Mobile Switching Centers (MSCs), Mobility Management Entities (MMEs), etc.), Operation and Maintenance (O&M) nodes, Operations Support System (OSS) nodes, Self-Organizing Network (SON) nodes, positioning nodes (e.g., Evolved Serving Mobile Location Center (E-SMLCs)), minimization of drive tests (MDTs), or any other suitable network node. More generally, however, network nodes may represent any suitable device (or group of devices) capable, configured, arranged, and/or operable to enable and/or provide a wireless device access to the wireless communication network or to provide some service to a wireless device that has accessed the wireless communication network.

Network nodes 115 may be a piece of networking equipment, including hardware and software, which communicatively interconnects other equipment on the network (e.g., wireless devices 110, other network devices, end stations). Some network devices are "multiple services network devices" that provide support for multiple networking functions (e.g., routing, bridging, switching, Layer 2 aggregation, session border control, Quality of Service, and/or subscriber management), and/or provide support for multiple application services (e.g., data, voice, and video). Subscriber end stations (e.g., servers, workstations, laptops, netbooks, palm tops, mobile phones, smartphones, multimedia phones, VOIP phones, user equipment, terminals, portable media players, GPS units, gaming systems, set-top boxes) access content/services provided over the Internet and/or content/services provided on virtual private networks (VPNs) overlaid on (e.g., tunneled through) the Internet. The content and/or services are typically provided by one or more end stations (e.g., server end stations) belonging to a service or content provider or end stations participating in a peer to peer service, and may include, for example, public webpages (e.g., free content, store fronts, search services), private webpages (e.g., username/password accessed webpages providing email services), and/or corporate networks over VPNs. Typically, subscriber end stations are coupled (e.g., through CPE coupled to an access network (wired or wirelessly)) to edge network devices, which are coupled (e.g., through one or more core network devices) to other edge network devices, which are coupled to other end stations (e.g., server end stations). One of ordinary skill in the art would realize that any network device, end station or other network apparatus can perform various functions described herein.

The term "node" may be used herein generically to refer both to wireless devices and network nodes, as each is respectively described above.

The terminology such as network node and wireless device should be considered non-limiting and does in particular not imply a certain hierarchical relation between the two; in general "network node" could be considered as a first device and "wireless device" as a second device, and these two devices communicate with each other over some radio channel.

Example embodiments of wireless devices 110, network nodes 115, and other network nodes (such as radio network controller or core network node) are described in more detail below with respect to FIGS. 9-15.

Although FIG. 1 illustrates a particular arrangement of network 100, the present disclosure contemplates that the various embodiments described herein may be applied to a variety of networks having any suitable configuration. For example, network 100 may include any suitable number of wireless devices 110 and network nodes 115, as well as any additional elements suitable to support communication between wireless devices or between a wireless device and another communication device (such as a landline telephone). In different embodiments, the wireless network 100 may comprise any number of wired or wireless networks, network nodes, base stations, controllers, wireless devices, relay stations, and/or any other components that may facilitate or participate in the communication of data and/or signals whether via wired or wireless connections.

Furthermore, the embodiments described herein may be implemented in any appropriate type of telecommunication system using any suitable components, and are applicable to any radio access technology (RAT) or multi-RAT systems in which a wireless device receives and/or transmits signals (e.g., data). For example, the various embodiments described herein may be applicable to NR, LTE, LTE-Advanced, 5G, UMTS, HSPA, GSM, cdma2000, WCDMA, WiMax, UMB, WiFi, another suitable RAT, or any suitable combination of one or more RATs. Thus, network 100 may represent any type of communication, telecommunication, data, cellular, and/or radio network or other type of system. In particular embodiments, the network 100 may be configured to operate according to specific standards or other types of predefined rules or procedures. Thus, particular embodiments of the wireless communication network may implement communication standards, such as NR, GSM, UMTS, LTE, and/or other suitable 2G, 3G, 4G, or 5G standards; wireless local area network (WLAN) standards, such as the IEEE 802.11 standards; and/or any other appropriate wireless communication standard, such as the Worldwide Interoperability for Microwave Access (WiMax), Bluetooth, and/or ZigBee standards.

Although certain embodiments may be described in the context of wireless transmissions in the downlink (DL), the present disclosure contemplates that the various embodiments are equally applicable in the uplink (UL).

As described above, the present disclosure contemplates various embodiments directed to a decoding process (e.g., in a node of network 100, such as wireless device 110 or network node 115) that allows soft information (typically in the format of extrinsic LLR) to be exchanged among code blocks of different transmissions associated with a given set of information bits, so that the soft information of an individual information bit is exchanged among all code blocks that contain the information bit. This allows each information bit to derive benefit from every (re)transmission that contains the bit, instead of only the most recent (re)transmission. In certain embodiments, the soft information may be expressed in the form of probabilities or log-likelihood ratios (LLR). The soft information may be derived in multiple ways. In one example embodiment, the soft information is derived based on the maximum a posteriori (MAP) probability of each bit. In another example embodiment, the soft information is derived based on the maximum likelihood (ML) probability of the codeword. Although certain embodiments may be described using examples in which the soft information is in the format of extrinsic LLR, the present disclosure is not limited to such an example. Rather, the present disclosure contemplates that other types of soft information may be used. As an additional non-limiting example, in certain embodiments the soft information may be in the format of a Euclidean distance calculation.

Figure 2:
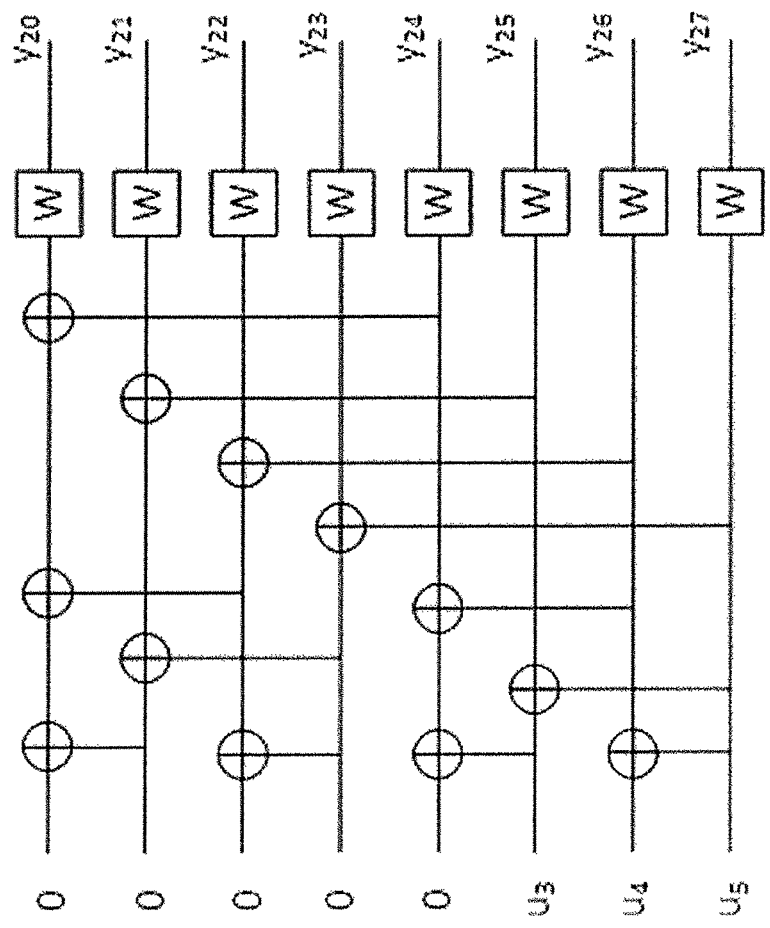
FIG. 2 illustrates an example of polar code structure in a second transmission (i.e., first retransmission) in HARQ incremental redundancy.
Figure 5:
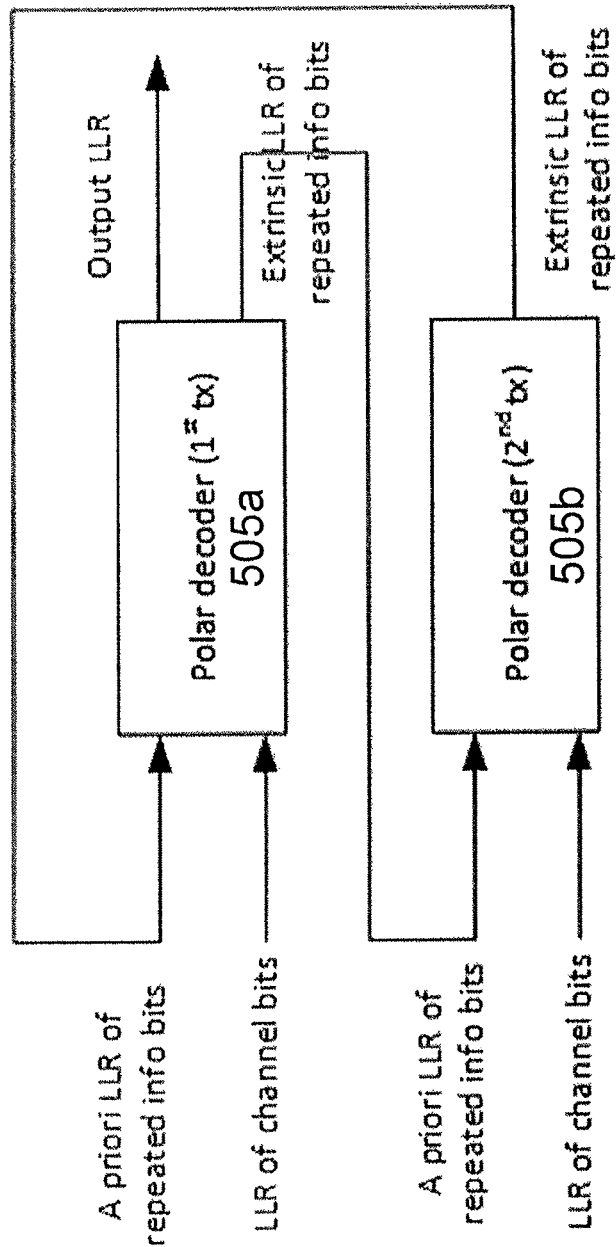
FIG. 5 illustrates an example of iterative decoding using two different transmissions in HARQ incremental redundancy, in accordance with certain embodiments.

FIG. 5 illustrates an example of iterative decoding using two different transmissions in HARQ incremental redundancy, in accordance with certain embodiments. In the example embodiment of FIG. 5, an iterative decoding process is described using, as an example, the first and second transmissions described above in relation to FIGS. 1 and 2. Each transmission is associated with a polar decoder 505 of a node. In the example of FIG. 5, the first transmission is associated with a first polar decoder 505a, and the second transmission is associated with a second polar decoder 505b. A generalization of this example embodiment to any number of transmissions is further described below in relation to FIG. 6.

One important observation is that the first and second transmissions described above in FIGS. 1 and 2, respectively, essentially use two different polar codes, and share a subset of information bits. As a result, these two different codes can be put together in an iterative decoding process, as shown in the example of FIG. 5.

Let extrinsic-LLR($u_i$, $n^{th}$ tx) denote the extrinsic log-likelihood ratio (LLR) of bit $u_i$ generated by the polar decoder for the $n^{th}$ transmissions. It depends on the difference between LLR of bit $u_i$ and the input extrinsic-LLR of bit $u_i$ to the polar decoder for $n^{th}$ transmissions. During initialization, the node sets extrinsic-LLR($u_i$, $2^{nd}$ tx)=0, for all i=3, 4, 5, and sets iteration number t to t=1.

For iteration t, the node performs the following steps:
1. Set a priori info of $\{u_0, u_1, u_2\}$ to zero, set a priori info $u_i$ to extrinsic-LLR($u_i$, $2^{nd}$ tx) for i=3, 4, 5.
2. Run polar decoder of 1st transmission (e.g., polar decoder 505a in the example of FIG. 5).
    a. Input:
        i. Extrinsic-LLR of repeated info bits $\{u_i: i=3, 4, 5\}$ from polar decoder of 2nd transmission (e.g., polar decoder 505b in the example of FIG. 5).
        ii. LLR of channel bits $\{y_{10}, y_{11}, \ldots, y_{17}\}$ (received from demodulator)
    b. Output: extrinsic-LLR($u_i$, 1st tx) for i=0, 1, 2, 3, 4, 5.
3. Set the a priori info of information bits $u_i$ extrinsic-LLR($u_i$, $1^{st}$ tx) for i=3, 4, 5.
4. Run Polar decoder of 2nd transmission 505b.
    a. Input:
        i. Extrinsic-LLR of repeated info bits $\{u_i: i=3, 4, 5\}$ from Polar decoder of 1st transmission 505a.
        ii. LLR of channel bits $\{y_{20}, y_{21}, \ldots, y_{27}\}$.
    b. Output: extrinsic-LLR($u_i$, 2nd tx) for i=3, 4, 5.
5. If t<$t_{max}$, increment t, and go back to Step 1. Otherwise, run Step 1, generate overall LLR of info bits $\{u_i: i=0, 1, 2, 3, 4, 5\}$ using polar decoder of 1st transmission 505a. The node makes a hard decision of info bits $\{u_i: i=0, 1, 2, 3, 4, 5\}$ based on the overall LLR.

Figure 6:
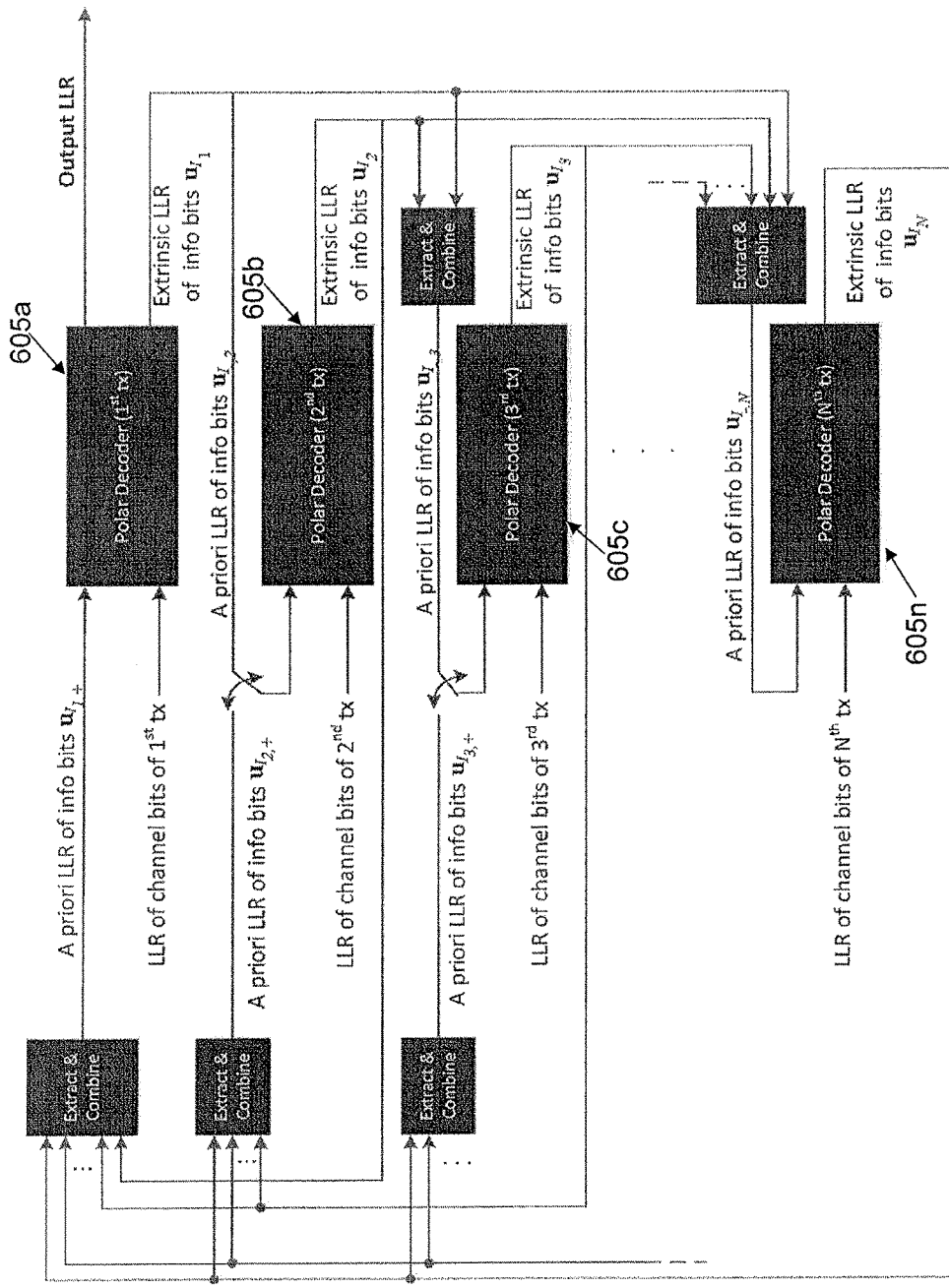
FIG. 6 illustrates an example of iterative decoding using N different transmissions in HARQ incremental redundancy, in accordance with certain embodiments.

FIG. 6 illustrates an example of iterative decoding using an arbitrary N different transmissions in HARQ incremental redundancy, in accordance with certain embodiments. In the example embodiment of FIG. 6, the N transmissions are the first transmission and (N−1) retransmissions associated with a same block of information bits in the HARQ process. Each transmission is associated with a polar decoder 605. In the example of FIG. 6, a first transmission is associated with polar decoder 605a, a second transmission is associated with polar decoder 605b, a third transmission is associated with polar decoder 605c, and an Nth transmission is associated with polar decoder 605n.

Let $I_i$ denote the set of indices of all non-frozen bits with respect to the 1st transmission that are transmitted in the $i^{th}$ transmission for any i≥1. Also let $u_{I_i} \triangleq \{u_k: k \in I_i\}$ denote the collection of bits whose indices with respect to the 1st transmission is in $I_i$.

Let $I_{i,j}$ denote a set of indices of non-frozen bits with respect to the 1st transmission that are re-transmitted in both the $i^{th}$ the $j^{th}$ transmissions for any i<j. Also let $u_{I_{i,j}} \triangleq \{u_k: k \in I_{i,j}\}$ denote the collection of bits whose indices with respect to the 1st transmission is in $I_{i,j}$. For notational simplicity, let $I_{i,+} \triangleq \cup_{k=i+1}^{N} I_{j,k}$ be the set of indices of non-frozen bits transmitted in both the $i^{th}$ transmission and all subsequent transmissions. Similarly, let $I_{-j} \triangleq \cup_{k=1}^{j-1} I_{j,k}$ denote the set of indices of non-frozen bits transmitted in both the $i^{th}$ transmission and all previous transmissions.

During initialization, the node sets extrinsic-LLR($u_i$, $n^{th}$ tx)=0, for all $i \in I_{n,+}$ and for all n=1, 2, ... N, and sets iteration number t to t=1.

For iteration t, the node performs the following steps, which are described separately below for forward propagation and backward propagation.

Figure 3:
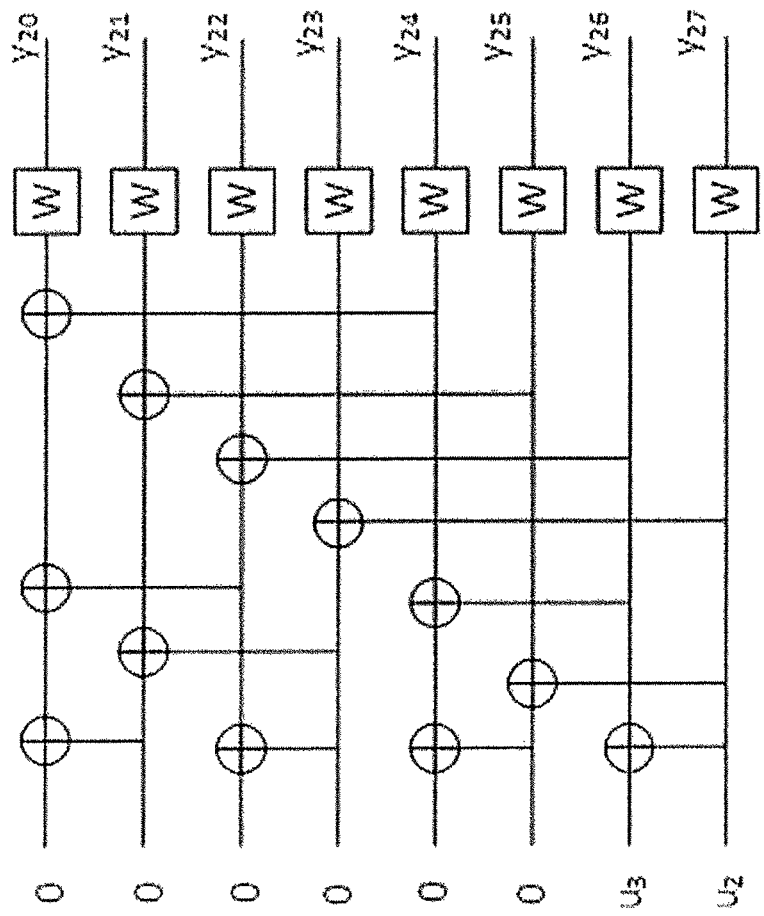
FIG. 3 illustrates an example of polar code structure in a third transmission (i.e., second retransmission) in HARQ incremental redundancy.

For forward propagation, for each decoder for the $n^{th}$ transmission, from n=1 to n=N, perform the following steps:
1. Extract and combine extrinsic-LLR from previous transmissions extrinsic-LLR($u_i$, $m^{th}$ tx) for $i \in I_{m,n}$ and m=1, 2, ..., n−1 to obtain extrinsic-LLR($u_i$, $1^{st}$ to $(n−1)^{th}$ tx) for $i \in I_{-,n}$.
2. Set a priori info $u_{-,n}$ to extrinsic-LLR($u_i$, $1^{st}$ to $(n-1)^{th}$ tx) for $i \in I_{-,n}$ and set a priori info for all other bits in $u_{I_n}$ to zero.
3. Run polar decoder of $n^{th}$ transmission.
   i. Input:
      1. Extrinsic-LLR of repeated info bits $u_{-,n}$ from polar decoders of previous transmissions.
      2. LLR of channel bits $y_n = (y_{n,0}, y_{n,1}, \ldots, y_{n,2^M})$ (received from demodulator), where M=3 for the example shown in FIG. 1-3.
   ii. Output: extrinsic-LLR($u_i$, $n^{th}$ tx) for $i \in I_n$.

For backward propagation, for each decoder for the $n^{th}$ transmission, from n=N back to n=1, perform the following steps:
1. Extract and combine extrinsic-LLR from subsequent transmissions extrinsic-LLR($u_i$, $m^{th}$ tx) for $i \in I_{m,n}$ and m=n+1, n+2, ..., N+1 to obtain extrinsic-LLR($u_i$, $(n+1)^{th}$ to $N^{th}$ tx) for $i \in I_{n,+}$.
2. Set the a priori info of information bits $u_{m+}$ to extrinsic-LLR($u_i$, $(n+1)^{th}$ to $N^{th}$ tx) for $i \in I_{n,+}$, and set a priori info for all other bits in $u_{I_n}$ to extrinsic-LLR($u_i$, $1^{st}$ to $(n-1)^{th}$ tx) for $i \in I_{-,n}$.
3. Run Polar decoder of $n^{th}$ transmission.
   a. Input:
      iii. Extrinsic-LLR of repeated info bits $u_{n,+}$ from polar decoders of all subsequent transmissions.
      iv. LLR of channel bits $y_n$.
   b. Output: extrinsic-LLR($u_i$, $n^{th}$ tx) for $i \in I_n$.

If t<$t_{max}$, increment t, and go back to Step 1. Otherwise, generate overall LLR of all info bits $u_{I_1}$ using polar decoder of 1st transmission. Make hard decision of info bits $u_{I_1}$ based on the overall LLR.

While the decoding procedure is described above to illustrate the basic principle of utilizing soft information between multiple polar decoders, it is understood that many variations can be done. For example, in certain embodiments the a priori LLR may be modified, rather than being used as is, in the polar decoder. One non-limiting example way to modify the a priori LLR is to scale it by a factor. The value of the factor is typically a real number between 0.0 and 1.0. The factor may or may not be the same for all constituent polar decoders.

In certain embodiments, after each of the n-th transmission (i.e., (n−1)-th retransmission), 2≤n<N, the extrinsic LLR is stored. When N-th transmission is received, the polar decoder corresponding to n-th transmission, 2≤n<N are not re-run, but the extrinsic LLR of the n-th transmission is retrieved from memory and used in the polar coder of N-th transmission and first transmission. This has the benefit of never having to run more than 2 polar decoders, even if there are more than 2 HARQ (re-)transmissions done for one block of information bits.

Figure 7:
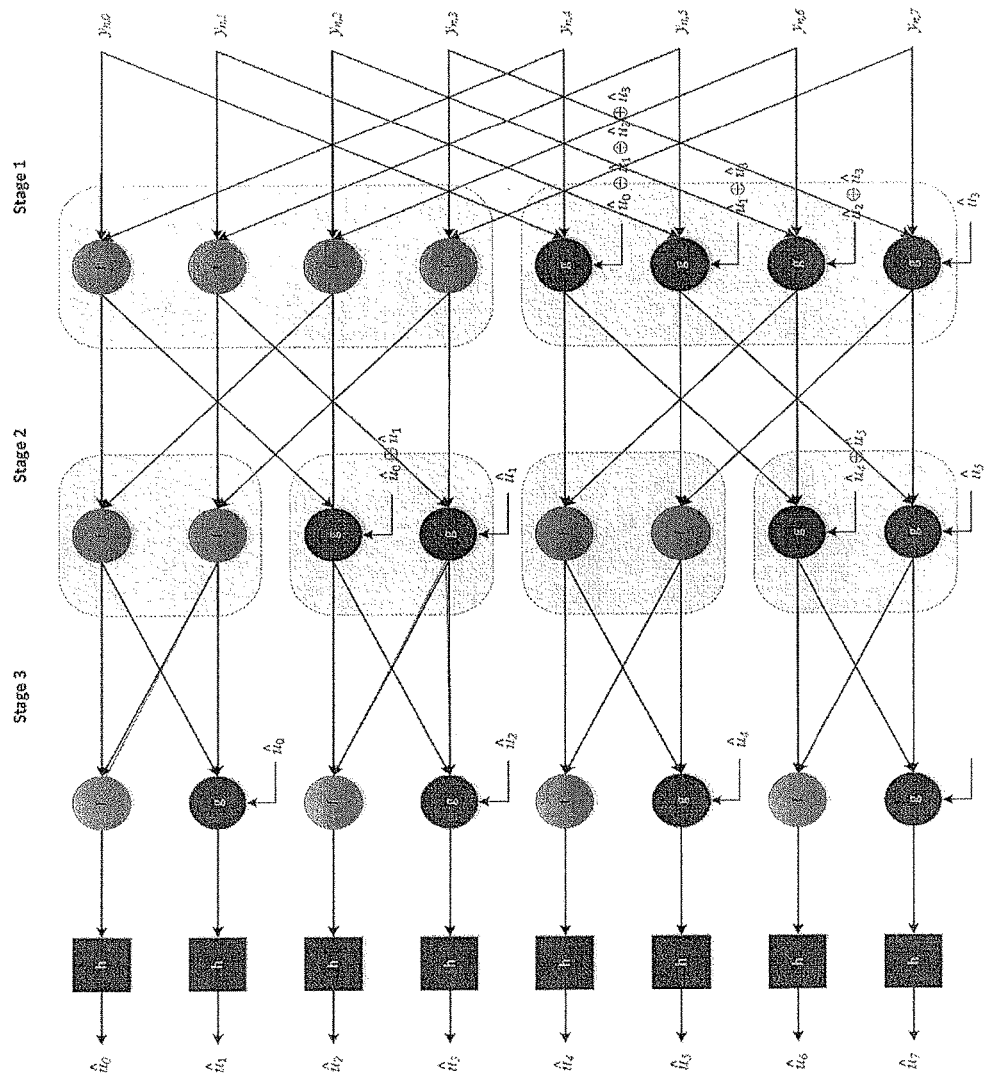
FIG. 7 illustrates an example of how soft and hard information is generated in successive decoding of polar codes, in accordance with certain embodiments.

FIG. 7 illustrates an example of how soft and hard information is generated in successive decoding of polar codes, in accordance with certain embodiments. More particularly, FIG. 7 illustrates how soft and hard information can be generated for the length-8 Polar code described above in relation to FIGS. 1-3. Let $y_n = (y_{n,0}, y_{n,1}, \ldots, y_{n,7})$ be the LLR of channel bits received from a demodulator, and $\hat{u}_i$ denotes the hard decision made on the bit $u_i$ for all t=0, 1, ..., 7.

Depending on the different bit positions of information bit $u_i$, function g and f are applied for each node. The two functions are expressed as $g(a, b) = a(-1)^{\hat{u}_{sum}} + b$ and $f(a, b) = 2 \tan h^{-1}(\tan h(a/2) \tan h(b/2))$, respectively. The function h is used to decide the estimated bits from the LLRs when the trellis is traced to the information bit $u_i$.

For information bits that use f(a,b) function before making hard decision, the hard decision is made using the modified expression:

$$LLR_{t,i} = LLR_{a,i} + f(a,b)$$

$$\hat{u}_i = h(LLR_{t,i})$$

where $LLR_{a,i}$ denotes the a priori information received on bit $u_i$. And the extrinsic information for $u_i$ is $LLR_{e,i} = LLR_{t,i} - LLR_{a,i} = f(a, b)$.

For information bits that use g(a,b) function before making hard decision, the hard decision is made using the modified expression:

$$LLR_{t,i} = LLR_{a,i} + g(a,b)$$

$$\hat{u}_i = h(LLR_{t,i})$$

And the extrinsic information for $u_i$ is $LLR_{e,i} = LLR_{t,i} - LLR_{a,i} = g(a, b)$.

Here $LLR_{a,i}$ is the a priori LLR info of $u_i$, which is a soft input to the constituent polar decoder. And $LLR_{e,i}$ is the extrinsic LLR of $u_i$, which is a soft output of the constituent polar decoder. Soft value $LLR_{t,i}$ is the total LLR of bit $u_i$.

Function h(x) is the function that makes the hard decision $\hat{u}_i$ which is an estimate of bit $u_i$:

$$h(x) = \begin{cases} = 0, & \text{if } x > 0 \\ = 1, & \text{if } x < 0 \end{cases}$$

Note that while many simplifications of the f(.) and g(.) functions exist, here we use the basic expression for ease of discussion.

Although the above described example uses the typical description of a SC decoder to illustrate the iterative decoding principle, other types of polar decoders can be used as well. Examples include, but are not limited to, list decoding of SC decoder, BP (belief propagation) decoder, etc. The various types of polar decoders can be used together with the iterative decoding principle, with soft information passing between two or more constituent polar decoders.

In particular, for list decoding, a different set of soft information (extrinsic LLRs) may be generated by each constituent polar decoder for each candidate in the list of decoding paths. All these different sets of soft information may then be exchanged with other constituent polar decoders, so that list decoding can continue to be performed in the decoding of other transmissions. As an alternative, to reduce complexity, the LLR outputs for each candidate in the list can be added to generate a single set of soft information (extrinsic LLRs) for the next polar decoder. In addition, when calculating the output LLRs, the decoder could also take into account the probability of observing the received signal assuming that the different candidates in the list were the true codewords. In the case of CRC-aided list decoding, for example as described in Tal, each constituent polar decoder may produce and exchange soft information only for the candidate in the list of decoding paths that passes CRC.

As a result of the foregoing embodiments, a decoder of a class of rate-compatible polar codes is enabled to effectively take advantage of the aggregated block lengths after multiple transmissions to improve the block error rate and the number of retransmissions needed to pass CRC for a target block error rate.

While the processes in FIGS. 5-7 and the accompanying description may show a particular order of operations performed by certain embodiments, it should be understood that such order is exemplary (e.g., alternative embodiments may perform the operations in a different order, combine certain operations, overlap certain operations, etc.).

While the present disclosure has described several example embodiments, those skilled in the art will recognize that the present disclosure is not limited to the example embodiments described, can be practiced with modification and alteration within the spirit and scope of the appended claims. The description is thus to be regarded as illustrative instead of limiting.

Figure 8:
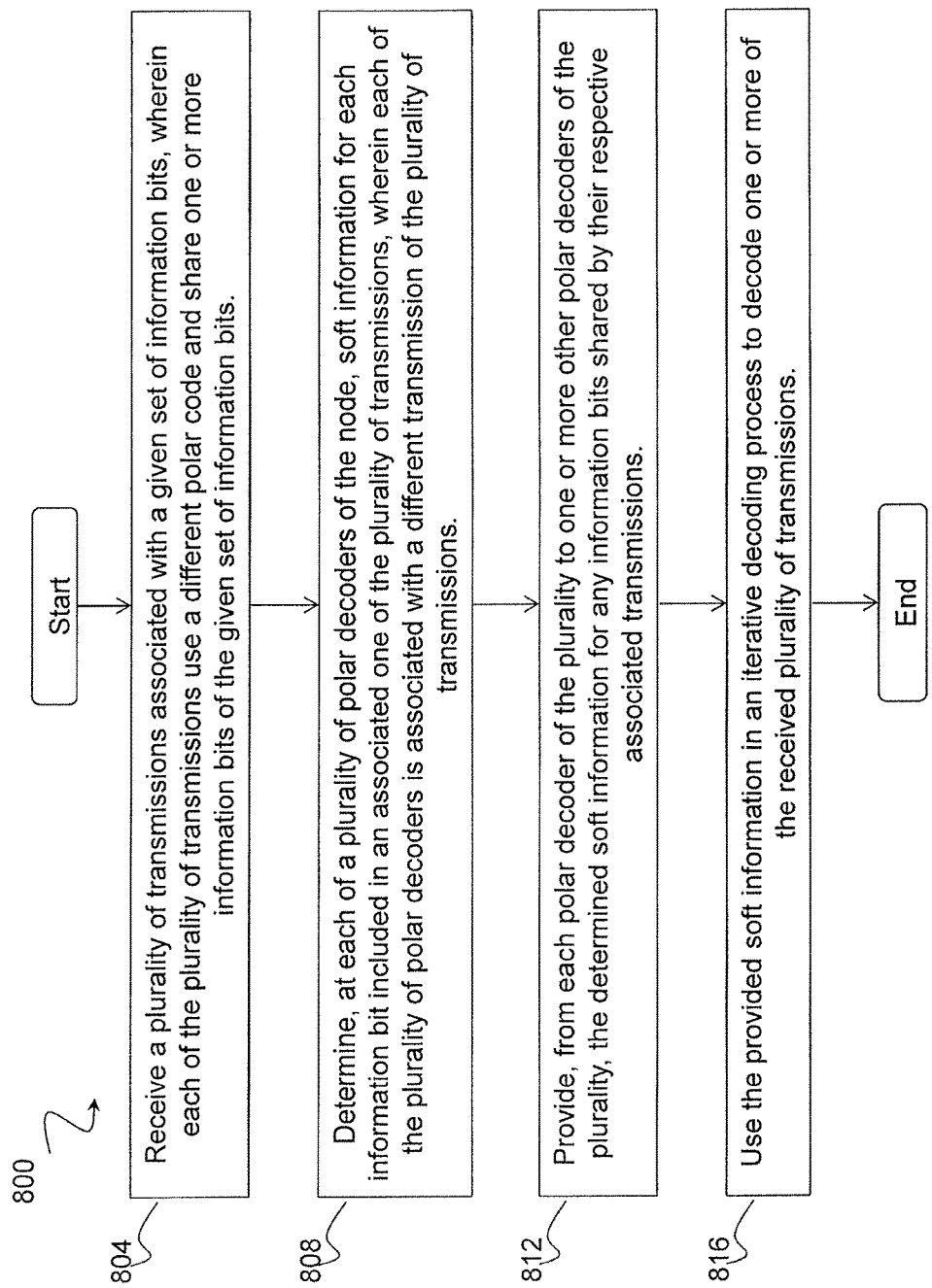
FIG. 8 is a flow diagram of a method in a node, in accordance with certain embodiments.

FIG. 8 is a flow diagram of a method 800 in a node, in accordance with certain embodiments. Method 800 begins at step 804, where the node receives a plurality of transmissions associated with a given set of information bits, wherein each of the plurality of transmissions use a different polar code and share one or more information bits of the given set of information bits. In certain embodiments, the plurality of transmissions associated with a given set of information bits may comprise an initial transmission and a plurality of retransmissions.

At step 808, the node determines, at each of a plurality of polar decoders of the node, soft information for each information bit included in an associated one of the plurality of transmissions, wherein each of the plurality of polar decoders is associated with a different transmission of the plurality of transmissions. The plurality of polar decoders may comprise successive cancellation decoders. In certain embodiments, the soft information may comprise one or more probabilities or LLRs. In certain embodiments, the method may comprise scaling the soft information by a factor. In certain embodiments, the soft information may be determined based on a LLR ratio of one or more channel bits received from a demodulator and the soft information provided from the one or more other polar decoders of the plurality for any information bits shared by their respective associated transmissions. In certain embodiments, the method may comprise storing the determined soft information.

At step 812, the node provides, from each polar decoder of the plurality to one or more other polar decoders of the plurality, the determined soft information for any information bits shared by their respective associated transmissions.

At step 816, the node uses the provided soft information in an iterative decoding process to decode one or more of the received plurality of transmissions. The soft information provided from the one or more other polar decoders of the plurality may comprise soft information from one or more polar decoders of previous transmissions for a subset of information bits shared by their respective transmissions. The soft information provided from the one or more other polar decoders of the plurality may comprise soft information from one or more polar decoders of subsequent transmissions for a subset of information bits shared by their respective transmissions. In certain embodiments, the method may comprise retrieving the stored soft information and using it to decode a first transmission of the plurality of transmissions and another transmission of the plurality of transmissions.

In certain embodiments, the method may comprise determining, at a first polar decoder associated with a first transmission of the plurality of transmissions, soft information for each information bit in the first transmission. The method may comprise providing, from the first polar decoder associated with the first transmission to a second polar decoder associated with a second transmission, the soft information for each information bit in the first transmission included in a subset of information bits shared by the first transmission and the second transmission. The method may comprise determining, at the second polar decoder associated with the second transmission of the plurality of transmissions, soft information for each information bit in the subset of information bits shared by the first transmission and the second transmission. The method may comprise providing, from the second polar decoder associated with the second transmission to the first polar decoder associated with the first transmission, the soft information for each information bit in the subset of information bits shared by the first transmission and the second transmission. In certain embodiments, the method may comprise determining, by the first polar decoder, a hard decision for each information bit of the first transmission based on the soft information provided by the second polar decoder for each information bit in the subset of information bits shared by the first transmission and the second transmission.

Figure 9:
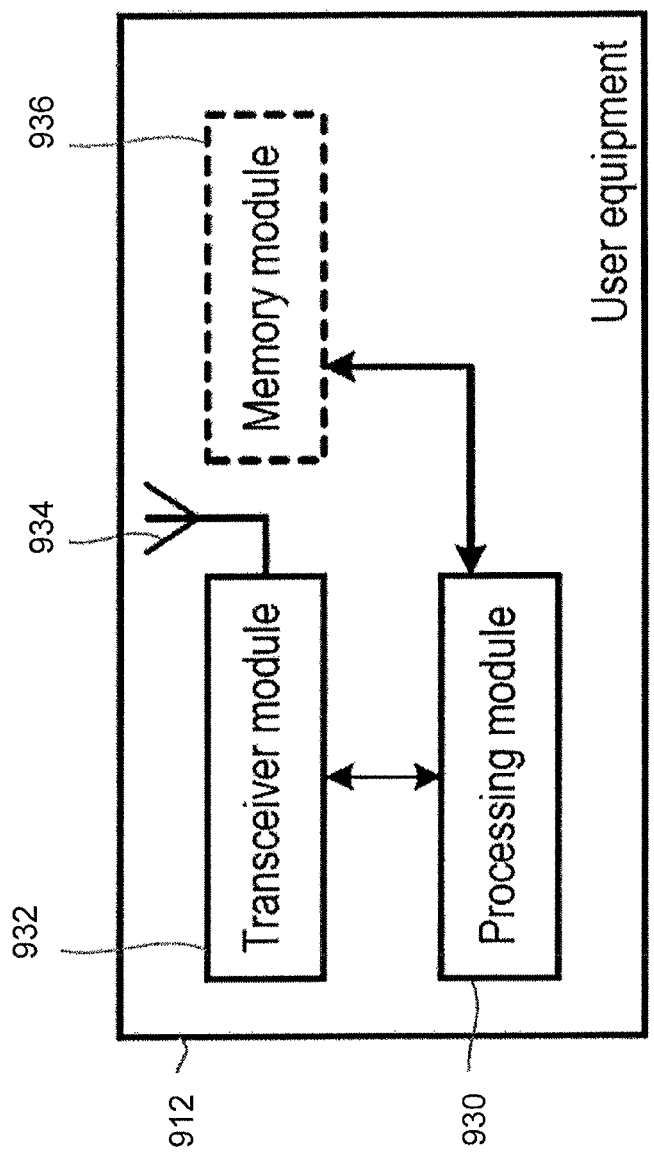
FIG. 9 is a block schematic of an exemplary UE, in accordance with certain embodiments.

FIG. 9 is a block schematic of an exemplary UE 912, in accordance with certain embodiments. UE 912 is an example of a wireless device, such as wireless device 110 described above in relation to FIG. 4 (e.g., a wirelessly connected device, such as in a vehicle), according to one exemplary embodiment that can be used in one or more of the non-limiting example embodiments described above. UE 912 comprises a processing module 930 that controls the operation of UE 912. Processing module 930 is connected to a receiver or transceiver module 932 with associated antenna(s) 934 that are used to receive signals from or both transmit signals to and receive signals from, for example, a base station in a network (e.g., a network node 115 in network 100 described above in relation to FIG. 4). In certain embodiments, to make use of discontinuous reception (DRX), processing module 930 can be configured to deactivate receiver or transceiver module 932 for specified lengths of time. UE 912 also comprises a memory module 936 that is connected to processing module 930 and stores program and other information and data required for the operation of UE 912. In some embodiments, UE 912 may optionally comprise a satellite positioning system (e.g., Global Positioning System (GPS)) that receiver module 938 that can use to determine the position and speed of movement of UE 912.

Figure 10:
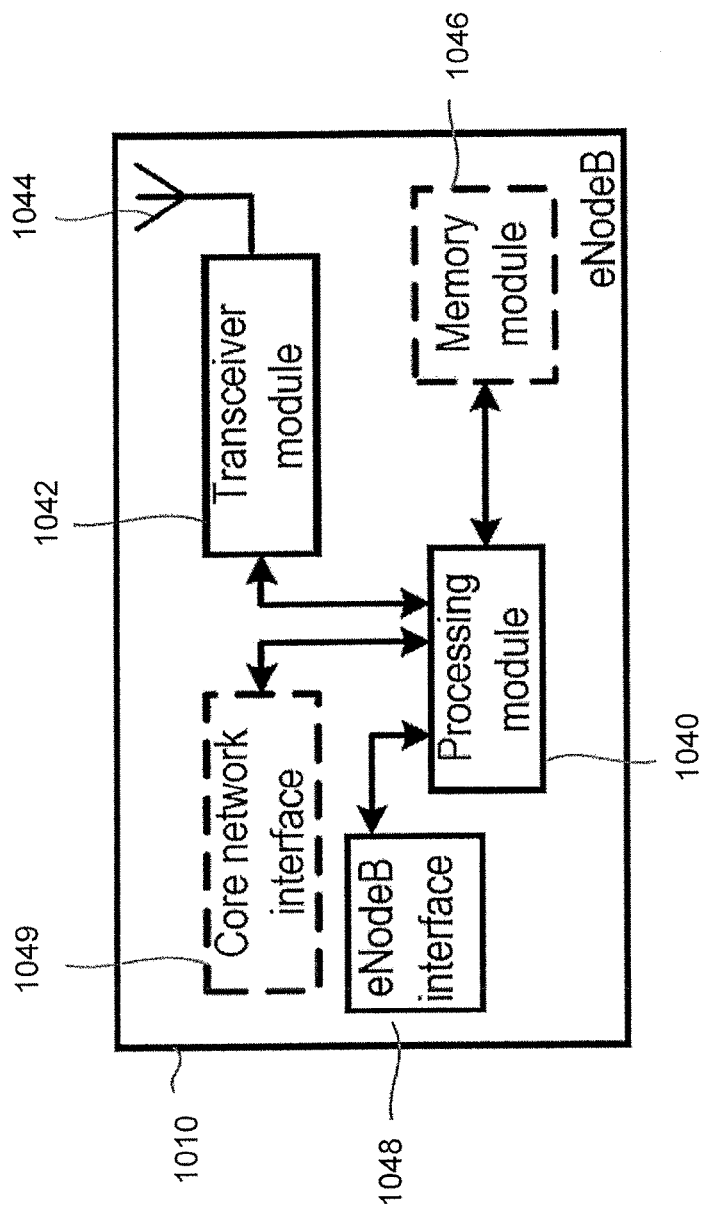
FIG. 10 is a block schematic of an exemplary eNodeB, in accordance with certain embodiments.

FIG. 10 is a block schematic of an exemplary eNB 1010, in accordance with certain embodiments. eNB 1010 is an example of a network node, such as network node 115 described above in relation to FIG. 4, that can be used in one or more of the non-limiting example embodiments described above. It will be appreciated that although a macro eNB will not in practice be identical in size and structure to a micro eNB, for the purposes of illustration, the base stations 1010 are assumed to include similar components. Thus, base station 1010 comprises processing module 1040 that controls the operation of base station 1010. Processing module 1040 is connected to transceiver module 1042 with associated antenna(s) 1044 that are used to transmit signals to, and receive signals from, wireless devices (e.g., wireless devices 110 in network 100 described above in relation to FIG. 4, such as mobile devices (e.g., in vehicles)). Base station 1010 also comprises memory module 1046 that is connected to processing module 1040 and that stores program and other information and data required for the operation of base station 1010. Base station 1010 also includes components and/or circuitry 1048 for allowing base station 1010 to exchange information with other base stations 1010 (for example via an X2 interface) and components and/or circuitry 1049 for allowing base station 1010 to exchange information with nodes in the core network (for example via the Si interface). It will be appreciated that base stations for use in other types of network (e.g., UTRAN or WCDMA RAN) will include similar components to those shown in FIG. 10 and appropriate interface circuitry 1048, 1049 for enabling communications with the other network nodes in those types of networks (e.g., other base stations, mobility management nodes and/or nodes in the core network). Another wireless device, such as a UE, could act as a node, according to certain embodiments.

Figure 11:
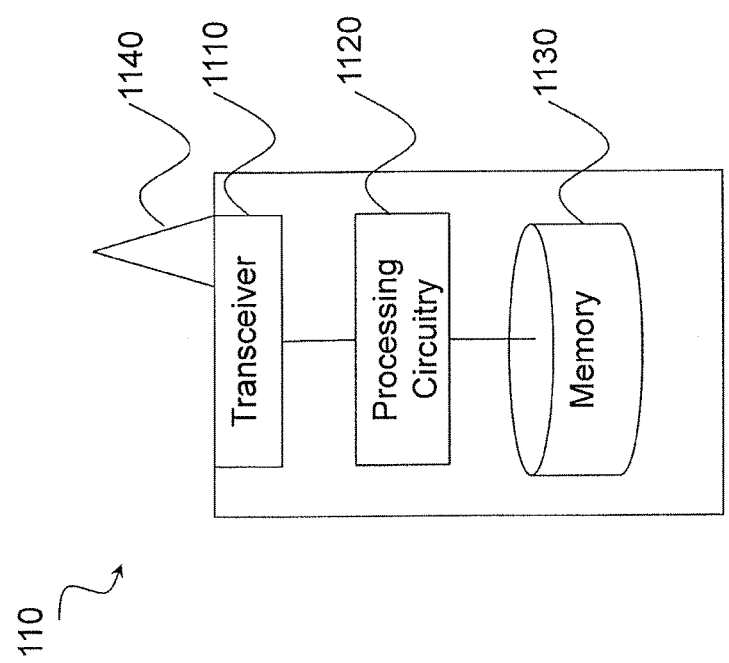
FIG. 11 is a block schematic of an exemplary wireless device, in accordance with certain embodiments.

FIG. 11 is a block schematic of an exemplary wireless device 110, in accordance with certain embodiments. Wireless device 110 may refer to any type of wireless device communicating with a node and/or with another wireless device in a cellular or mobile communication system. Examples of wireless device 110 include a mobile phone, a smart phone, a PDA, a portable computer (e.g., laptop, tablet), a sensor, an actuator, a modem, a MTC device/M2M device, LEE, LME, USB dongles, a D2D capable device, or another device that can provide wireless communication. A wireless device 110 may also be referred to as UE, a station (STA), a device, or a terminal in some embodiments. Wireless device 110 includes transceiver 1110, processing circuitry 1120, and memory 1130. In some embodiments, transceiver 1110 facilitates transmitting wireless signals to and receiving wireless signals from network node 115 (e.g., via antenna 1140), processing circuitry 1120 executes instructions to provide some or all of the functionality described above as being provided by wireless device 110, and memory 1130 stores the instructions executed by processing circuitry 1120.

Processing circuitry 1120 may include any suitable combination of hardware and software implemented in one or more modules to execute instructions and manipulate data to perform some or all of the described functions of wireless device 110, such as the functions of wireless device 110 described above in relation to FIGS. 1-8. In some embodiments, processing circuitry 1120 may include, for example, one or more computers, one or more central processing units (CPUs), one or more microprocessors, one or more applications, one or more application specific integrated circuits (ASICs), one or more field programmable gate arrays (FPGAs) and/or other logic.

Memory 1130 is generally operable to store instructions, such as a computer program, software, an application including one or more of logic, rules, algorithms, code, tables, etc. and/or other instructions capable of being executed by processing circuitry 1120. Examples of memory 1130 include computer memory (for example, Random Access Memory (RAM) or ROM), mass storage media (for example, a hard disk), removable storage media (for example, a Compact Disk (CD) or a Digital Video Disk (DVD)), and/or or any other volatile or non-volatile, non-transitory computer-readable and/or computer-executable memory devices that store information, data, and/or instructions that may be used by processing circuitry 1120.

Other embodiments of wireless device 110 may include additional components beyond those shown in FIG. 11 that may be responsible for providing certain aspects of the wireless device's functionality, including any of the functionality described above and/or any additional functionality (including any functionality necessary to support the solution described above). As just one example, wireless device 110 may include input devices and circuits, output devices, and one or more synchronization units or circuits, which may be part of the processing circuitry 1120. Input devices include mechanisms for entry of data into wireless device 110. For example, input devices may include input mechanisms, such as a microphone, input elements, a display, etc. Output devices may include mechanisms for outputting data in audio, video and/or hard copy format. For example, output devices may include a speaker, a display, etc.

Figure 12:
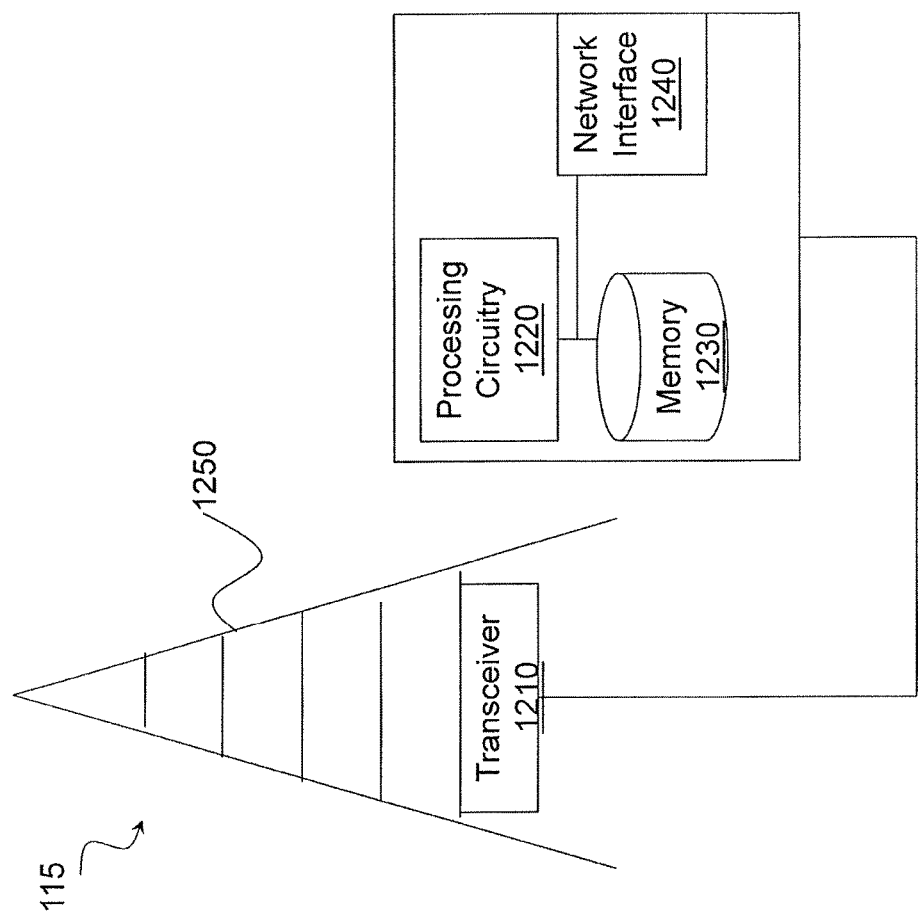
FIG. 12 is a block schematic of an exemplary network node, in accordance with certain embodiments.

FIG. 12 is a block schematic of an exemplary network node 115, in accordance with certain embodiments. Network node 115 may be any type of radio network node or any network node that communicates with a UE and/or with another network node. Examples of network node 115 include an eNB, a gNB, a node B, a BS, a wireless AP (e.g., a Wi-Fi AP), a low power node, a BTS, relay, donor node controlling relay, transmission points, transmission nodes, RRU, RRH, MSR radio node such as MSR BS, nodes in DAS, O&M, OSS, SON, positioning node (e.g., E-SMLC), MDT, or any other suitable network node. Network nodes 115 may be deployed throughout network 100 as a homogenous deployment, heterogeneous deployment, or mixed deployment. A homogeneous deployment may generally describe a deployment made up of the same (or similar) type of network nodes 115 and/or similar coverage and cell sizes and inter-site distances. A heterogeneous deployment may generally describe deployments using a variety of types of network nodes 115 having different cell sizes, transmit powers, capacities, and inter-site distances. For example, a heterogeneous deployment may include a plurality of low-power nodes placed throughout a macro-cell layout. Mixed deployments may include a mix of homogenous portions and heterogeneous portions.

Network node 115 may include one or more of transceiver 1210, processing circuitry 1220, memory 1230, and network interface 1240. In some embodiments, transceiver 1210 facilitates transmitting wireless signals to and receiving wireless signals from wireless device 110 (e.g., via antenna 1250), processing circuitry 1220 executes instructions to provide some or all of the functionality described above as being provided by a network node 115, memory 1230 stores the instructions executed by processing circuitry 1220, and network interface 1240 communicates signals to backend network components, such as a gateway, switch, router, Internet, PSTN, core network nodes or radio network controllers 130, etc.

Processing circuitry 1220 may include any suitable combination of hardware and software implemented in one or more modules to execute instructions and manipulate data to perform some or all of the described functions of network node 115, such as those described above in relation to FIGS. 1-8. In some embodiments, processing circuitry 1220 may include, for example, one or more computers, one or more CPUs, one or more microprocessors, one or more applications, one or more ASICs, one or more FPGAs, and/or other logic.

Memory 1230 is generally operable to store instructions, such as a computer program, software, an application including one or more of logic, rules, algorithms, code, tables, etc. and/or other instructions capable of being executed by processing circuitry 1220. Examples of memory 1230 include computer memory (for example, RAM or ROM), mass storage media (for example, a hard disk), removable storage media (for example, a CD or a DVD), and/or or any other volatile or non-volatile, non-transitory computer-readable and/or computer-executable memory devices that store information.

In some embodiments, network interface 1240 is communicatively coupled to processing circuitry 1220 and may refer to any suitable device operable to receive input for network node 115, send output from network node 115, perform suitable processing of the input or output or both, communicate to other devices, or any combination of the preceding. Network interface 1240 may include appropriate hardware (e.g., port, modem, network interface card, etc.) and software, including protocol conversion and data processing capabilities, to communicate through a network.

Other embodiments of network node 115 may include additional components beyond those shown in FIG. 12 that may be responsible for providing certain aspects of the radio network node's functionality, including any of the functionality described above and/or any additional functionality (including any functionality necessary to support the solutions described above). The various different types of network nodes may include components having the same physical hardware but configured (e.g., via programming) to support different radio access technologies, or may represent partly or entirely different physical components.

Figure 13:
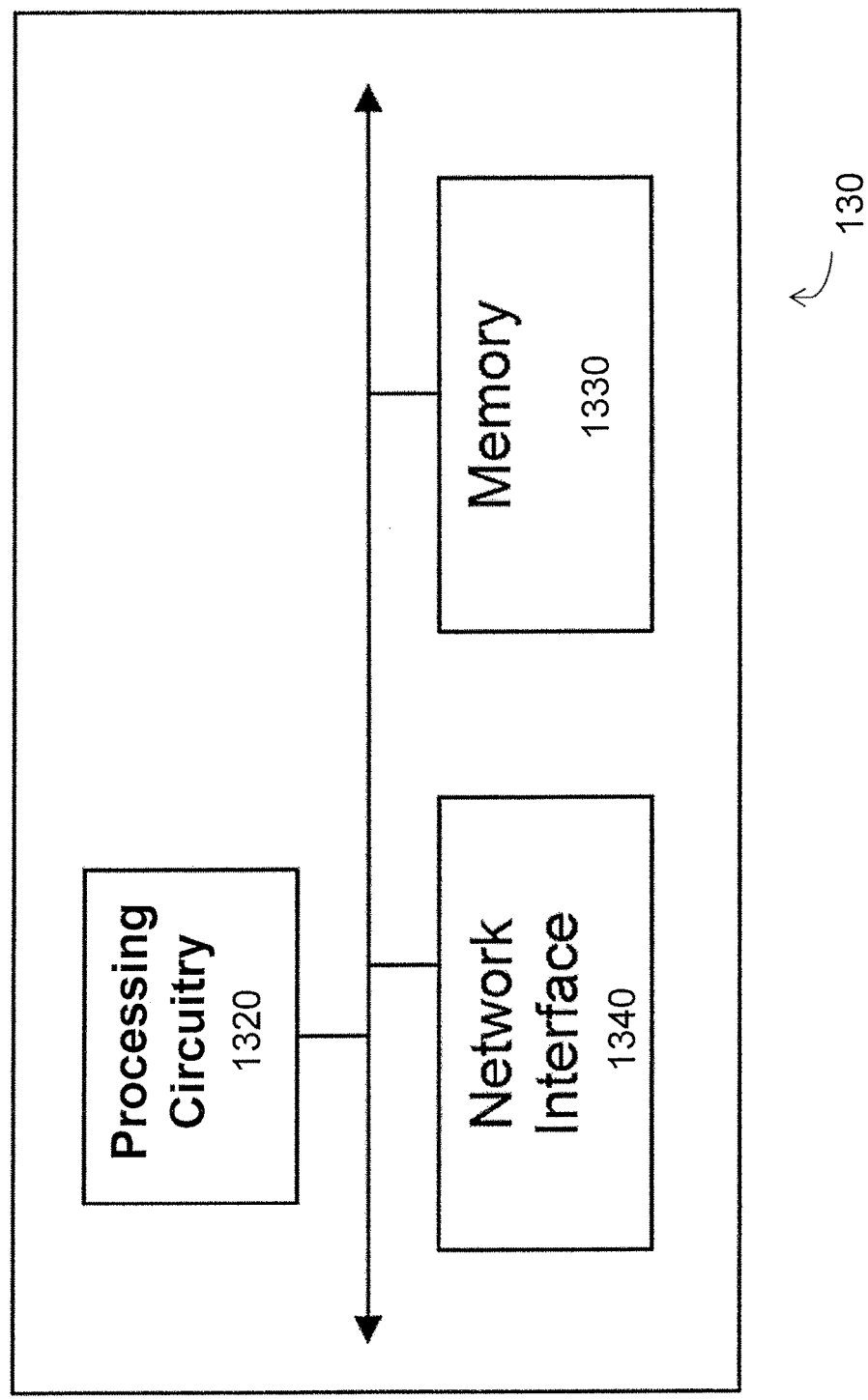
FIG. 13 is a block schematic of an exemplary radio network controller or core network node, in accordance with certain embodiments.

FIG. 13 is a block schematic of an exemplary radio network controller or core network node 130, in accordance with certain embodiments. Examples of network nodes can include a MSC, a serving GPRS support node (SGSN), a MME, a RNC, a BSC, and so on. The radio network controller or core network node 130 includes processing circuitry 1320, memory 1330, and network interface 1340. In some embodiments, processing circuitry 1320 executes instructions to provide some or all of the functionality described above as being provided by the network node, memory 1330 stores the instructions executed by processing circuitry 1320, and network interface 1340 communicates signals to any suitable node, such as a gateway, switch, router, Internet, PSTN, network nodes 115, radio network controllers or core network nodes 130, etc.

Processing circuitry 1320 may include any suitable combination of hardware and software implemented in one or more modules to execute instructions and manipulate data to perform some or all of the described functions of the radio network controller or core network node 130. In some embodiments, processing circuitry 1320 may include, for example, one or more computers, one or more CPUs, one or more microprocessors, one or more applications, one or more ASICs, one or more FPGAs, and/or other logic.

Memory 1330 is generally operable to store instructions, such as a computer program, software, an application including one or more of logic, rules, algorithms, code, tables, etc. and/or other instructions capable of being executed by processing circuitry 1320. Examples of memory 1330 include computer memory (for example, RAM or ROM), mass storage media (for example, a hard disk), removable storage media (for example, a CD or a DVD), and/or or any other volatile or non-volatile, non-transitory computer-readable and/or computer-executable memory devices that store information.

In some embodiments, network interface 1340 is communicatively coupled to processing circuitry 1320 and may refer to any suitable device operable to receive input for the network node, send output from the network node, perform suitable processing of the input or output or both, communicate to other devices, or any combination of the preceding. Network interface 1340 may include appropriate hardware (e.g., port, modem, network interface card, etc.) and software, including protocol conversion and data processing capabilities, to communicate through a network.

Other embodiments of the network node may include additional components beyond those shown in FIG. 13 that may be responsible for providing certain aspects of the network node's functionality, including any of the functionality described above and/or any additional functionality (including any functionality necessary to support the solution described above).

Figure 14:
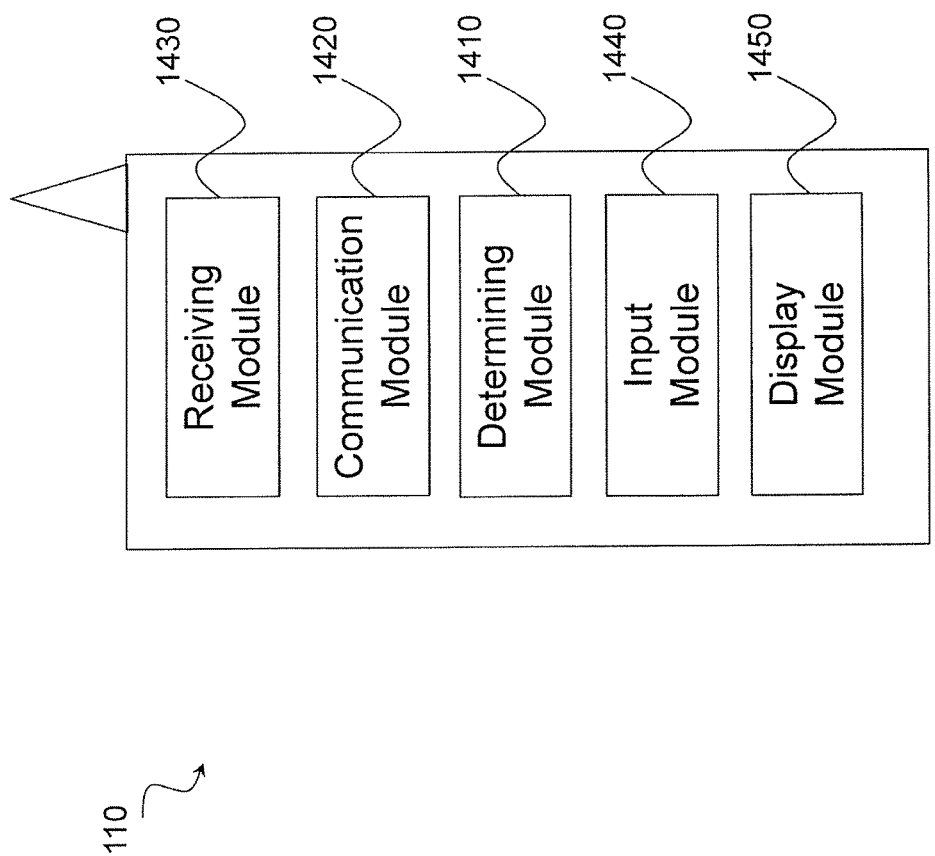
FIG. 14 is a block schematic of an exemplary wireless device, in accordance with certain embodiments.

FIG. 14 is a schematic block diagram of an exemplary wireless device, in accordance with certain embodiments. Wireless device 110 may include one or more modules. For example, wireless device 110 may include a determining module 1410, a communication module 1420, a receiving module 1430, an input module 1440, a display module 1450, and any other suitable modules. In some embodiments, one or more of determining module 1410, communication module 1420, receiving module 1430, input module 1440, display module 1450, or any other suitable module may be implemented using one or more processors, such as processing circuitry 1120 described above in relation to FIG. 11. In certain embodiments, the functions of two or more of the various modules may be combined into a single module. Wireless device 110 may perform the methods for soft decoding of rate-compatible polar codes described above in relation to FIGS. 1-8.

Determining module 1410 may perform the processing functions of wireless device 110. In certain embodiments, wireless device 110 may perform the functions of the node described above. In such a scenario, determining module 1410 may determine, at each of a plurality of polar decoders of the node, soft information for each information bit included in an associated one of a plurality of transmissions, wherein each of the plurality of polar decoders is associated with a different transmission of the plurality of transmissions. In certain embodiments, determining module 1410 may determine the soft information based on a LLR of one or more channel bits received from a demodulator and the soft information provided from the one or more other polar decoders of the plurality for any information bits shared by their respective associated transmissions. In certain embodiments, determining module 1410 may scale the soft information by a factor.

As another example, determining module 1410 may use the provided soft information in an iterative decoding process to decode one or more of the received plurality of transmissions.

As still another example, determining module 1410 may provide, from each polar decoder of the plurality to one or more other polar decoders of the plurality, the determined soft information for any information bits shared by their respective associated transmissions. In certain embodiments, determining module 1410 may determine, at a first polar decoder associated with a first transmission of the plurality of transmissions, soft information for each information bit in the first transmission. Determining module 1410 may provide, from the first polar decoder associated with the first transmission to a second polar decoder associated with a second transmission, the soft information for each information bit in the first transmission included in a subset of information bits shared by the first transmission and the second transmission. Determining module 1410 may determine, at the second polar decoder associated with the second transmission of the plurality of transmissions, soft information for each information bit in the subset of information bits shared by the first transmission and the second transmission. Determining module 1410 may provide, from the second polar decoder associated with the second transmission to the first polar decoder associated with the first transmission, the soft information for each information bit in the subset of information bits shared by the first transmission and the second transmission. Determining module 1410 may determine a hard decision for each information bit of the first transmission based on the soft information provided by the second polar decoder for each information bit in the subset of information bits shared by the first transmission and the second transmission.

As another example, determining module 1410 may store the determined soft information, for example in memory, such as memory 1130 described above in relation to FIG. 11. In certain embodiments, determining module 1410 may retrieve the stored soft information and using it to decode a first transmission of the plurality of transmissions and another transmission of the plurality of transmissions.

Determining module 1410 may include or be included in one or more processors, such as processing circuitry 1120 described above in relation to FIG. 11. Determining module 1410 may include analog and/or digital circuitry configured to perform any of the functions of determining module 1410 and/or processing circuitry 1120 described above. The functions of determining module 1410 described above may, in certain embodiments, be performed in one or more distinct modules.

Communication module 1420 may perform the transmission functions of wireless device 110. In certain embodiments, wireless device 110 may perform the functions of the node described above. In such a scenario, communication module 1420 may send (e.g., to a network node) a plurality of transmissions associated with a given set of information bits, wherein each of the plurality of transmissions use a different polar code and share one or more information bits of the given set of information bits. Communication module 1420 may include a transmitter and/or a transceiver, such as transceiver 1110 described above in relation to FIG. 11. Communication module 1420 may include circuitry configured to wirelessly transmit messages and/or signals. In particular embodiments, communication module 1420 may receive messages and/or signals for transmission from determining module 1410. In certain embodiments, the functions of communication module 1420 described above may be performed in one or more distinct modules.

Receiving module 1430 may perform the receiving functions of wireless device 110. In certain embodiments, wireless device 110 may perform the functions of the node described above. In such a scenario, receiving module 1430 may receive a plurality of transmissions associated with a given set of information bits, wherein each of the plurality of transmissions use a different polar code and share one or more information bits of the given set of information bits. Receiving module 1430 may include a receiver and/or a transceiver. Receiving module 1430 may include a receiver and/or a transceiver, such as transceiver 1110 described above in relation to FIG. 11. Receiving module 1430 may include circuitry configured to wirelessly receive messages and/or signals. In particular embodiments, receiving module 1430 may communicate received messages and/or signals to determining module 1410. The functions of receiving module 1430 described above may, in certain embodiments, be performed in one or more distinct modules.

Input module 1440 may receive user input intended for wireless device 110. For example, the input module may receive key presses, button presses, touches, swipes, audio signals, video signals, and/or any other appropriate signals. The input module may include one or more keys, buttons, levers, switches, touchscreens, microphones, and/or cameras. The input module may communicate received signals to determining module 1410. The functions of input module 1440 described above may, in certain embodiments, be performed in one or more distinct modules.

Display module 1450 may present signals on a display of wireless device 110. Display module 1450 may include the display and/or any appropriate circuitry and hardware configured to present signals on the display. Display module 1450 may receive signals to present on the display from determining module 1410. The functions of display module 1450 described above may, in certain embodiments, be performed in one or more distinct modules.

Determining module 1410, communication module 1420, receiving module 1430, input module 1440, and display module 1450 may include any suitable configuration of hardware and/or software. Wireless device 110 may include additional modules beyond those shown in FIG. 14 that may be responsible for providing any suitable functionality, including any of the functionality described above and/or any additional functionality (including any functionality necessary to support the various solutions described herein).

FIG. 15 is a schematic block diagram of an exemplary network node 115, in accordance with certain embodiments. Network node 115 may include one or more modules. For example, network node 115 may include determining module 1510, communication module 1520, receiving module 1530, and any other suitable modules. In some embodiments, one or more of determining module 1510, communication module 1520, receiving module 1530, or any other suitable module may be implemented using one or more processors, such as processing circuitry 1220 described above in relation to FIG. 12. In certain embodiments, the functions of two or more of the various modules may be combined into a single module. Network node 115 may perform the methods for soft decoding of rate-compatible polar codes described above with respect to FIGS. 1-8.

Determining module 1510 may perform the processing functions of network node 115. In certain embodiments, network node 115 may perform the functions of the node described above. In such a scenario, determining module 1510 may determine, at each of a plurality of polar decoders of the node, soft information for each information bit included in an associated one of a plurality of transmissions, wherein each of the plurality of polar decoders is associated with a different transmission of the plurality of transmissions. In certain embodiments, determining module 1510 may determine the soft information based on a LLR of one or more channel bits received from a demodulator and the soft information provided from the one or more other polar decoders of the plurality for any information bits shared by their respective associated transmissions. In certain embodiments, determining module 1510 may scale the soft information by a factor.

As another example, determining module 1510 may use the provided soft information in an iterative decoding process to decode one or more of the received plurality of transmissions.

As still another example, determining module 1510 may provide, from each polar decoder of the plurality to one or more other polar decoders of the plurality, the determined soft information for any information bits shared by their respective associated transmissions. In certain embodiments, determining module 1510 may determine, at a first polar decoder associated with a first transmission of the plurality of transmissions, soft information for each information bit in the first transmission. Determining module 1510 may provide, from the first polar decoder associated with the first transmission to a second polar decoder associated with a second transmission, the soft information for each information bit in the first transmission included in a subset of information bits shared by the first transmission and the second transmission. Determining module 1510 may determine, at the second polar decoder associated with the second transmission of the plurality of transmissions, soft information for each information bit in the subset of information bits shared by the first transmission and the second transmission. Determining module 1510 may provide, from the second polar decoder associated with the second transmission to the first polar decoder associated with the first transmission, the soft information for each information bit in the subset of information bits shared by the first transmission and the second transmission. Determining module 1510 may determine a hard decision for each information bit of the first transmission based on the soft information provided by the second polar decoder for each information bit in the subset of information bits shared by the first transmission and the second transmission.

As another example, determining module 1510 may store the determined soft information, for example in memory, such as memory 1230 described above in relation to FIG. 12. In certain embodiments, determining module 1510 may retrieve the stored soft information and using it to decode a first transmission of the plurality of transmissions and another transmission of the plurality of transmissions.

Determining module 1510 may include or be included in one or more processors, such as processing circuitry 1220 described above in relation to FIG. 12. Determining module 1510 may include analog and/or digital circuitry configured to perform any of the functions of determining module 1510 and/or processing circuitry 1220 described above. The functions of determining module 1510 may, in certain embodiments, be performed in one or more distinct modules.

Communication module 1520 may perform the transmission functions of network node 115. In certain embodiments, network node 115 may perform the functions of the node described above. In such a scenario, communication module 1520 may send (e.g., to a wireless device) a plurality of transmissions associated with a given set of information bits, wherein each of the plurality of transmissions use a different polar code and share one or more information bits of the given set of information bits. Communication module 1520 may transmit messages to one or more of wireless devices 110. Communication module 1520 may include a transmitter and/or a transceiver, such as transceiver 1210 described above in relation to FIG. 12. Communication module 1520 may include circuitry configured to wirelessly transmit messages and/or signals. In particular embodiments, communication module 1520 may receive messages and/or signals for transmission from determining module 1510 or any other module. The functions of communication module 1520 may, in certain embodiments, be performed in one or more distinct modules.

Receiving module 1530 may perform the receiving functions of network node 115. In certain embodiments, network node 115 may perform the functions of the node described above. In such a scenario, receiving module 1530 may receive a plurality of transmissions associated with a given set of information bits, wherein each of the plurality of transmissions use a different polar code and share one or more information bits of the given set of information bits. Receiving module 1430 may include a receiver and/or a transceiver. Receiving module 1530 may receive any suitable information from a wireless device. Receiving module 1530 may include a receiver and/or a transceiver, such as transceiver 1210 described above in relation to FIG. 12. Receiving module 1530 may include circuitry configured to wirelessly receive messages and/or signals. In particular embodiments, receiving module 1530 may communicate received messages and/or signals to determining module 1510 or any other suitable module. The functions of receiving module 1530 may, in certain embodiments, be performed in one or more distinct modules.

Determining module 1510, communication module 1520, and receiving module 1530 may include any suitable configuration of hardware and/or software. Network node 115 may include additional modules beyond those shown in FIG. 15 that may be responsible for providing any suitable functionality, including any of the functionality described above and/or any additional functionality (including any functionality necessary to support the various solutions described herein).

Modifications, additions, or omissions may be made to the systems and apparatuses described herein without departing from the scope of the disclosure. The components of the systems and apparatuses may be integrated or separated. Moreover, the operations of the systems and apparatuses may be performed by more, fewer, or other components. Additionally, operations of the systems and apparatuses may be performed using any suitable logic comprising software, hardware, and/or other logic. As used in this document, "each" refers to each member of a set or each member of a subset of a set.

Modifications, additions, or omissions may be made to the methods described herein without departing from the scope of the disclosure. The methods may include more, fewer, or other steps. Additionally, steps may be performed in any suitable order.

Although this disclosure has been described in terms of certain embodiments, alterations and permutations of the embodiments will be apparent to those skilled in the art. Accordingly, the above description of the embodiments does not constrain this disclosure. Other changes, substitutions, and alterations are possible without departing from the spirit and scope of this disclosure, as defined by the following claims.

Abbreviations used in the preceding description include:
3 GPP 3$^{rd}$ Generation Partnership Project
AP Access Point
ASIC Application Specific Integrated Circuit
BER Block Error Rate
BP Belief Propagation
BS Base Station
BSC Base Station Controller
BTS Base Transceiver Station
CD Compact Disk
CPE Customer Premises Equipment
CPU Central Processing Unit
CRC Cyclic Redundancy Check
D2D Device-to-device
DAS Distributed Antenna System
DL Downlink
DRX Discontinuous Reception
DVD Digital Video Disk
eNB evolved Node B
E-SMLC Evolved Serving Mobile Location Center
FPGA Field Programmable Gate Array
GPS Global Positioning System
GSM Global System for Mobile Communications
HARQ Hybrid Automatic Repeat Request
IoT Internet of Things
IP Internet Protocol
IR Incremental Redundancy
LAN Local Area Network
LDPC Low-Density Parity-Check
LEE Laptop Embedded Equipment
LLR Log-Likelihood Ratio
LME Laptop Mounted Equipment
LTE Long Term Evolution
M2M Machine-to-Machine
MAC Message Authentication Code
MAN Metropolitan Area Network
MAP Maximum A Posteriori
MCF, Multi-cell/multicast Coordination Entity
MCG Master Cell Group
MCS Modulation level and coding scheme
MDT Minimization of Drive Test
MeNB Master eNodeB
ML Maximum Likelihood
MME Mobility Management Entity
MSC Mobile Switching Center
MSR Multi-standard Radio
MTC Machine-Type Communication
NAS Non-Access Stratum
NB-IoT Narrow band Internet of Things
NR New Radio
O&M Operations and Management
OSS Operations Support System
PSTN Public Switched Telephone Network
RAM Random Access Memory
RAN Radio Access Network
RAT Radio Access Technology
RNC Radio Network Controller
ROM Read-Only Memory
RRC Radio Resource Control
RRH Remote Radio Head
RRU Remote Radio Unit
SC Successive Cancellation
SCG Secondary Cell Group
SCL Successive Cancellation List
SeNB Secondary eNodeB
SON Self-Organizing Network
UE User Equipment
UL Uplink
UMTS Universal Mobile Telecommunications System
VOIP Voice Over Internet Protocol
WAN Wide Area Network
WiMax Worldwide Interoperability for Microwave Access (WiMax)
WLAN Wireless Local Area Network

The invention claimed is:

1. A method in a node, comprising:
receiving a plurality of transmissions associated with a given set of information bits, wherein each of the plurality of transmissions use a different polar code and share one or more information bits of the given set of information bits;
determining, at each of a plurality of polar decoders of the node, soft information for each information bit included in an associated one of the plurality of transmissions, wherein each of the plurality of polar decoders is associated with a different transmission of the plurality of transmissions;
providing, from each polar decoder of the plurality to one or more other polar decoders of the plurality, the determined soft information for any information bits shared by their respective associated transmissions; and
using the provided soft information in an iterative decoding process to decode one or more of the received plurality of transmissions.

2. The method of claim 1, wherein the soft information comprises one or more of probabilities or log-likelihood ratios.

3. The method of claim 1, wherein the soft information is determined based on a log-likelihood ratio of one or more channel bits received from a demodulator and the soft information provided from the one or more other polar decoders of the plurality for any information bits shared by their respective associated transmissions.

4. The method of claim 3, wherein the soft information provided from the one or more other polar decoders of the plurality comprises soft information from one or more polar decoders of previous transmissions for a subset of information bits shared by their respective transmissions.

5. The method of claim 3, wherein the soft information provided from the one or more other polar decoders of the plurality comprises soft information from one or more polar decoders of subsequent transmissions for a subset of information bits shared by their respective transmissions.

6. The method of claim 1, comprising scaling the soft information by a factor.

7. The method of claim 1, comprising:
determining, at a first polar decoder associated with a first transmission of the plurality of transmissions, soft information for each information bit in the first transmission;
providing, from the first polar decoder associated with the first transmission to a second polar decoder associated with a second transmission, the soft information for each information bit in the first transmission included in a subset of information bits shared by the first transmission and the second transmission;
determining, at the second polar decoder associated with the second transmission of the plurality of transmissions, soft information for each information bit in the subset of information bits shared by the first transmission and the second transmission;
providing, from the second polar decoder associated with the second transmission to the first polar decoder associated with the first transmission, the soft information for each information bit in the subset of information bits shared by the first transmission and the second transmission.

8. The method of claim 7, comprising:
determining, by the first polar decoder, a hard decision for each information bit of the first transmission based on the soft information provided by the second polar decoder for each information bit in the subset of information bits shared by the first transmission and the second transmission.

9. The method of claim 1, comprising storing the determined soft information.

10. The method of claim 9, comprising retrieving the stored soft information and using it to decode a first transmission of the plurality of transmissions and another transmission of the plurality of transmissions.

11. The method of claim 1, wherein the plurality of transmissions associated with a given set of information bits comprise an initial transmission and a plurality of retransmissions.

12. The method of claim 1, wherein the plurality of polar decoders comprise successive cancellation decoders.

13. A node, comprising:
processing circuitry, the processing circuitry configured to:
receive a plurality of transmissions associated with a given set of information bits, wherein each of the plurality of transmissions use a different polar code and share one or more information bits of the given set of information bits;
determine, at each of a plurality of polar decoders of the node, soft information for each information bit included in an associated one of the plurality of transmissions, wherein each of the plurality of polar decoders is associated with a different transmission of the plurality of transmissions;
provide, from each polar decoder of the plurality to one or more other polar decoders of the plurality, the determined soft information for any information bits shared by their respective associated transmissions; and
use the provided soft information in an iterative decoding process to decode one or more of the received plurality of transmissions.

14. The node of claim 13, wherein the soft information comprises one or more of probabilities or log-likelihood ratios.

15. The node of claim 13, wherein the processing circuitry is configured to determine the soft information based on a log-likelihood ratio of one or more channel bits received from a demodulator and the soft information provided from the one or more other polar decoders of the plurality for any information bits shared by their respective associated transmissions.

16. The node of claim 15, wherein the soft information provided from the one or more other polar decoders of the plurality comprises soft information from one or more polar decoders of previous transmissions for a subset of information bits shared by their respective transmissions.

17. The node of claim 15, wherein the soft information provided from the one or more other polar decoders of the plurality comprises soft information from one or more polar decoders of subsequent transmissions for a subset of information bits shared by their respective transmissions.

18. The node of claim 13, comprising scaling the soft information by a factor.

19. The node of claim 13, wherein the processing circuitry is configured to:
determine, at a first polar decoder associated with a first transmission of the plurality of transmissions, soft information for each information bit in the first transmission;
providing, from the first polar decoder associated with the first transmission to a second polar decoder associated with a second transmission, the soft information for each information bit in the first transmission included in a subset of information bits shared by the first transmission and the second transmission;
determine, at the second polar decoder associated with the second transmission of the plurality of transmissions, soft information for each information bit in the subset of information bits shared by the first transmission and the second transmission;
provide, from the second polar decoder associated with the second transmission to the first polar decoder associated with the first transmission, the soft information for each information bit in the subset of information bits shared by the first transmission and the second transmission.

20. The node of claim 19, wherein the processing circuitry is configured to:
determine, by the first polar decoder, a hard decision for each information bit of the first transmission based on the soft information provided by the second polar decoder for each information bit in the subset of information bits shared by the first transmission and the second transmission.

21. The node of claim 13, wherein the processing circuitry is configured to store the determined soft information.

22. The node of claim 21, wherein the processing circuitry is configured to retrieve the stored soft information and use it to decode a first transmission of the plurality of transmissions and another transmission of the plurality of transmissions.

23. The node of claim 13, wherein the plurality of transmissions associated with a given set of information bits comprise an initial transmission and a plurality of retransmissions.

24. The node of claim 13, wherein the plurality of polar decoders comprise successive cancellation decoders.

* * * * *